(12) United States Patent
Johnson et al.

(10) Patent No.: US 12,373,719 B2
(45) Date of Patent: Jul. 29, 2025

(54) SYSTEMS AND METHODS FOR SIMULATING A QUANTUM PROCESSOR

(71) Applicant: D-WAVE SYSTEMS INC., Burnaby (CA)

(72) Inventors: Mark W. Johnson, Vancouver (CA); Mauricio Reis Filho, Burnaby (CA); Mark H. Volkmann, Burnaby (CA); Ilya V. Perminov, Vancouver (CA); Paul I. Bunyk, Pt. Roberts, WA (US)

(73) Assignee: D-WAVE SYSTEMS INC., Burnaby (CA)

( * ) Notice: Subject to any disclaimer, the term of this patent is extended or adjusted under 35 U.S.C. 154(b) by 871 days.

(21) Appl. No.: 17/617,388

(22) PCT Filed: Jul. 10, 2020

(86) PCT No.: PCT/US2020/041703
§ 371 (c)(1),
(2) Date: Dec. 8, 2021

(87) PCT Pub. No.: WO2021/011412
PCT Pub. Date: Jan. 21, 2021

(65) Prior Publication Data
US 2022/0253740 A1 Aug. 11, 2022

Related U.S. Application Data

(60) Provisional application No. 62/879,946, filed on Jul. 29, 2019, provisional application No. 62/873,711, filed on Jul. 12, 2019.

(51) Int. Cl.
*G06N 10/20* (2022.01)
*G06F 30/30* (2020.01)
(Continued)

(52) U.S. Cl.
CPC ............. *G06N 10/20* (2022.01); *G06N 10/80* (2022.01); *G06F 30/30* (2020.01); *G06F 30/3308* (2020.01); *G06J 3/00* (2013.01)

(58) Field of Classification Search
CPC .... G06N 10/20; G06N 10/80; G06F 30/3308; G06F 30/30; G06J 3/00
See application file for complete search history.

(56) References Cited

U.S. PATENT DOCUMENTS

| 6,373,294 B1 | 4/2002 | Bentley |
| 6,911,664 B2 | 6/2005 | Il et al. |

(Continued)

FOREIGN PATENT DOCUMENTS

| CN | 107580752 A | 1/2018 |
| JP | 2019047126 A | 3/2019 |

(Continued)

OTHER PUBLICATIONS

Mengyu Zhang ("QuMAsim: A Quantum Architecture Simulation and Verification Platform"—Published 2018 (72 pages) (Year: 2018).*

(Continued)

*Primary Examiner* — Quoc A Tran
(74) *Attorney, Agent, or Firm* — Cozen O'Connor

(57) ABSTRACT

A digital processor simulates a quantum computing system by implementing a QPU model including a set of representation models and a device connectivity representation to simulate a quantum processor design or a physical quantum processor. The digital processor receives an analog waveform and generates a digital waveform representation comprising a set of waveform values that correspond to biases applied to programmable devices in a quantum processor. The digital processor selects a subset of waveform values based on channels in the device connectivity representation. The digital processor implements a representation model to (Continued)

compute a response based on the waveform values and a plurality of physical parameter values, the physical parameters characterizing a programmable device in a quantum processor. The device connectivity representation can be generated from a design implementation, validated against a set of rules, and adjusted to change the device connectivity representation until all of the rules are passed.

20 Claims, 7 Drawing Sheets

(51) Int. Cl.
  G06F 30/3308      (2020.01)
  G06J 3/00         (2006.01)
  G06N 10/80        (2022.01)

(56)         References Cited

U.S. PATENT DOCUMENTS

| | | | |
|---|---|---|---|
| 7,135,701 | B2 | 11/2006 | Amin et al. |
| 7,230,266 | B2 | 6/2007 | Hilton et al. |
| 7,307,275 | B2 | 12/2007 | Lidar et al. |
| 7,418,283 | B2 | 8/2008 | Amin |
| 7,533,068 | B2 | 5/2009 | Maassen et al. |
| 7,619,437 | B2 | 11/2009 | Thom et al. |
| 7,639,035 | B2 | 12/2009 | Berkley |
| 7,843,209 | B2 | 11/2010 | Berkley |
| 7,876,248 | B2 | 1/2011 | Berkley et al. |
| 7,898,282 | B2 | 3/2011 | Harris et al. |
| 7,921,072 | B2 | 4/2011 | Bohannon et al. |
| 7,932,907 | B2 | 4/2011 | Nachmanson et al. |
| 7,984,012 | B2 | 7/2011 | Coury et al. |
| 8,008,942 | B2 | 8/2011 | Van et al. |
| 8,018,244 | B2 | 9/2011 | Berkley |
| 8,035,540 | B2 | 10/2011 | Berkley et al. |
| 8,098,179 | B2 | 1/2012 | Bunyk et al. |
| 8,169,231 | B2 | 5/2012 | Berkley |
| 8,174,305 | B2 | 5/2012 | Harris |
| 8,175,995 | B2 | 5/2012 | Amin |
| 8,190,548 | B2 | 5/2012 | Choi |
| 8,195,596 | B2 | 6/2012 | Rose et al. |
| 8,283,943 | B2 | 10/2012 | Van Den Brink et al. |
| 8,421,053 | B2 | 4/2013 | Bunyk et al. |
| 8,429,108 | B2 | 4/2013 | Eusterbrock |
| 8,560,282 | B2 | 10/2013 | Love et al. |
| 8,854,074 | B2 | 10/2014 | Berkley |
| 8,874,477 | B2 | 10/2014 | Hoffberg |
| 8,972,237 | B2 | 3/2015 | Wecker |
| 9,189,217 | B2 | 11/2015 | Von Platen et al. |
| 9,588,940 | B2 | 3/2017 | Hamze et al. |
| 9,710,758 | B2 | 7/2017 | Bunyk et al. |
| 10,031,887 | B2 | 7/2018 | Raymond |
| 10,650,050 | B2 | 5/2020 | He et al. |
| 10,872,021 | B1 | 12/2020 | Tezak et al. |
| 11,010,145 | B1 * | 5/2021 | Smith ............... G06F 8/41 |
| 11,062,227 | B2 | 7/2021 | Amin et al. |
| 11,087,616 | B2 | 8/2021 | Rom et al. |
| 11,422,958 | B2 | 8/2022 | Boothby et al. |
| 2002/0180006 | A1 | 12/2002 | Franz et al. |
| 2002/0188578 | A1 | 12/2002 | Amin et al. |
| 2003/0102470 | A1 | 6/2003 | Il et al. |
| 2003/0169041 | A1 | 9/2003 | Coury et al. |
| 2005/0008050 | A1 | 1/2005 | Fischer et al. |
| 2007/0180586 | A1 | 8/2007 | Amin |
| 2007/0239366 | A1 | 10/2007 | Hilton et al. |
| 2008/0052055 | A1 | 2/2008 | Rose et al. |
| 2009/0078931 | A1 | 3/2009 | Berkley |
| 2009/0192041 | A1 | 7/2009 | Johansson et al. |
| 2009/0259905 | A1 | 10/2009 | Silva et al. |
| 2009/0261319 | A1 | 10/2009 | Maekawa et al. |
| 2009/0289638 | A1 | 11/2009 | Farinelli et al. |
| 2010/0150222 | A1 | 6/2010 | Meyers et al. |
| 2011/0054876 | A1 | 3/2011 | Biamonte et al. |
| 2011/0057169 | A1 | 3/2011 | Harris et al. |
| 2011/0060780 | A1 | 3/2011 | Berkley et al. |
| 2011/0065586 | A1 | 3/2011 | Maibaum et al. |
| 2011/0138344 | A1 | 6/2011 | Ahn |
| 2012/0023053 | A1 | 1/2012 | Harris et al. |
| 2012/0087867 | A1 | 4/2012 | McCamey et al. |
| 2012/0144159 | A1 | 6/2012 | Pesetski et al. |
| 2012/0265718 | A1 | 10/2012 | Amin et al. |
| 2013/0106476 | A1 | 5/2013 | Joubert et al. |
| 2013/0117200 | A1 | 5/2013 | Thom |
| 2013/0267032 | A1 | 10/2013 | Tsai et al. |
| 2014/0229722 | A1 | 8/2014 | Harris |
| 2015/0262073 | A1 | 9/2015 | Lanting |
| 2015/0286748 | A1 | 10/2015 | Lilley |
| 2015/0363708 | A1 | 12/2015 | Amin et al. |
| 2016/0079968 | A1 | 3/2016 | Strand et al. |
| 2016/0233860 | A1 | 8/2016 | Naaman |
| 2016/0238360 | A1 | 8/2016 | Naud et al. |
| 2016/0267032 | A1 | 9/2016 | Rigetti et al. |
| 2016/0364653 | A1 | 12/2016 | Chow et al. |
| 2017/0017894 | A1 | 1/2017 | Lanting et al. |
| 2017/0104695 | A1 | 4/2017 | Naaman |
| 2017/0300454 | A1 | 10/2017 | Maassen Van Den Brink et al. |
| 2017/0351967 | A1 | 12/2017 | Babbush et al. |
| 2017/0364362 | A1 | 12/2017 | Lidar et al. |
| 2018/0101786 | A1 | 4/2018 | Boothby |
| 2018/0123544 | A1 | 5/2018 | Abdo |
| 2019/0019098 | A1 | 1/2019 | Przybysz |
| 2019/0042677 | A1 | 2/2019 | Matsuura et al. |
| 2019/0042967 | A1 | 2/2019 | Yoscovits et al. |
| 2019/0043919 | A1 | 2/2019 | George et al. |
| 2019/0266508 | A1 | 8/2019 | Bunyk et al. |
| 2019/0378874 | A1 | 12/2019 | Rosenblatt et al. |
| 2019/0391093 | A1 | 12/2019 | Achlioptas et al. |
| 2019/0392352 | A1 | 12/2019 | Lampert et al. |
| 2020/0005155 | A1 | 1/2020 | Datta et al. |
| 2020/0183768 | A1 | 6/2020 | Berkley et al. |
| 2020/0334563 | A1 | 10/2020 | Gambetta et al. |
| 2020/0342345 | A1 | 10/2020 | Farhi et al. |
| 2020/0349326 | A1 | 11/2020 | King |
| 2020/0379768 | A1 | 12/2020 | Berkley et al. |
| 2020/0380396 | A1 | 12/2020 | Raymond |
| 2022/0207404 | A1 | 6/2022 | Boothby |
| 2024/0028938 | A1 | 1/2024 | Berkley et al. |

FOREIGN PATENT DOCUMENTS

| | | |
|---|---|---|
| JP | 2019513249 A | 5/2019 |
| KR | 101446943 B1 | 10/2014 |
| WO | 2005093649 A1 | 10/2005 |
| WO | 2007085074 A1 | 8/2007 |
| WO | 2012064974 A2 | 5/2012 |
| WO | 2014123980 A1 | 8/2014 |
| WO | 2016182608 A2 | 11/2016 |
| WO | 2016183213 A1 | 11/2016 |
| WO | 2017214331 A1 | 12/2017 |
| WO | 2018064535 A1 | 4/2018 |
| WO | 2018111242 A1 | 6/2018 |
| WO | 2019005206 A1 | 1/2019 |
| WO | 2019070935 A2 | 4/2019 |
| WO | 2019168721 A1 | 9/2019 |
| WO | 2020112185 A2 | 6/2020 |
| WO | 2021011412 A1 | 1/2021 |

OTHER PUBLICATIONS

Xiang Fu ("Quantum Control Architecture: Bridging the Gap between Quantum Software and Hardware"—Published Dec. 11, 2018.*
Amin, M., "Searching for Quantum Speedup in Quasistatic Quantum Annealers," arXiv:1503.04216v2 [quant-ph] Nov. 19, 2015, 5 pages.
Extended EP Search Report mailed Jun. 26, 2023, EP App No. 20841331.0-11203—14 pages.
Amin et al., "First Order Quantum Phase Transition in Adiabatic Quantum Computation", arXiv:0904.1387v3, Dec. 15, 2009, 5 pages.

(56) References Cited

OTHER PUBLICATIONS

Amin et al., Macroscopic Resonant Tunneling in the Presence of Low Frequency Noise, arXiv:0712.0845 [cond-mat. mes-hall], May 13, 2008, pp. 1-4.
Amin, "Effect of Local Minima on Adiabatic Quantum Optimization," Physical Review Letters 100(130503), 2008, 4 pages.
Aspuru-Guzik. "Simulated Quantum Computation of Molecular Energies", Science, Sep. 9, 2005.
Berkley et al., "Tunneling spectroscopy using a probe qubit", arXiv:1210.6310v2 [cond-mat.supr-con] Jan. 3, 2013.
Boothby, K., "Input/Output Systems and Methods for Superconducting Devices," U.S. Appl. No. 62/860,098, filed Jun. 11, 2019, 31 pages.
Boothby, K., et al., "Systems and Methods for Efficient Input and Output to Quantum Processors," U.S. Appl. No. 62/851,377, filed May 22, 2019, 40 pages.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Byrd. "A Limited-Memory Algorithm For Bound-Contrained Optimization". SIAM Journal on Scientific Computing, Jun. 17, 2005.
Chen, Y. et al., "Multiplexed Dispersive Readout of Superconducting Phase Qubits," Applied Physics Letters 101 (182601), 2012, 4 pages.
Dhande et al. "End-User Calibration for Quantum Annealing". Engineering Project Report—UBC, Jan. 6, 2019.
D-Wave, "Technical Description of the D-Wave Quantum Processing Unit", D-Wave User Manual 09-1109A-M, Sep. 24, 2018, 56 pages.
Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Harris et al., "Probing Noise in Flux Qubits via Macroscopic Resonant Tunneling", arXiv:0712.0838v2 [cond-mat.mes-hall], Feb. 8, 2008, pp. 1-4.
Heinsoo, J. et al., "Rapid high-fidelity multiplexed readout of superconducting qubits," arXiv:1801.07904v1 [quant-ph], Jan. 24, 2018, 13 pages.
International Search Report for PCT/US2019/047747, mailed Jun. 26, 2020, 4 pages.
International Search Report for PCT/US2020/037222, mailed Sep. 17, 2020, 3 pages.
King et al., "Observation of topological phenomena in a programmable lattice of 1,800 qubits", arXiv:1803.02047 [quant-ph], Mar. 6, 2018, 17 pages.
Lanting et al., "Geometrical dependence of the low-frequency noise in superconducting flux qubits", Physical Review B, 79, 060509, Jun. 5, 2009, 4 pages.
Lanting et al., "Probing High Frequency Noise with Macroscopic Resonant Tunneling", arXiv:1103.1931v1 [cond-mat. supr-con], Mar. 20, 2011, 5 pages.
Lanting, T., "Observation of Co-tunneling in Pairs of Coupled Flux Qubits", arXiv:1006.0028v1 [cond-mat.supr-con], May 31, 2010, 4 pages.
Manucharyan et al., "Fluxonium: single Cooper pair circuit free of charge offsets", arXiv:0906.0831v2, [cond-mat.mes-hall] Oct. 20, 2009, 13 pages.
Michotte, S., "Qubit Dispersive Readout Scheme with a Microstrip Squid Amplifier," arXiv:0812.0220v1 [cond-mat.supr-con], Dec. 1, 2008, 4 pages.
Nielsen. "The Fermionic canonical commutation relations and the Jordan-Wigner transform", School of Physical Sciences, Jul. 29, 2005.
Petersan et al., "Measurement of resonant frequency and quality factor of microwave resonators: Comparison of methods," Journal of Applied Physics, vol. 84, No. 6, Sep. 15, 1998, 11 pages.
Sete et al., "A Functional Architecture for Scalable Quantum Computing", 2016 IEEE International Conference on Rebooting Computing (ICRC), Oct. 17, 2016, 5 pages.
Swenson et al., "Operation of a titanium nitride superconducting microresonator detector in the nonlinear regime," arXiv:1305.4281v1 [cond-mat.supr-con], May 18, 2013, 11 pages.
Tolpygo et al., "Advanced Fabrication Process for Superconducting Very Large Scale Integrated Circuits", https://arxiv.org/abs/1509.05081, accessed Sep. 16, 2015.
Tolpygo et al., "Advanced Fabrication Processes for Superconducting Very Large Scale Integrated Circuits," IEEE Transactions on Applied Superconductivity 26(3):1-10, Jan. 19, 2016.
Van Harlingen et al., "Decoherence in Josephson-junction qubits due to critical current fluctuations", arXiv:cond-mat/0404307v1 [cond-mat.supr-con], Apr. 13, 2004, 24 pages.
Vollmer, R., "Fast and scalable readout for fault-tolerant quantum computing with superconducting Qubits," Master's Thesis, QuTech, Department of Quantum Nanoscience, Delft University of Technology, Jul. 10, 2018, 80 pages.
Whittaker, J.D. et al., "A Frequency and Sensitivity Tunable Microresonator Array for High-Speed Quantum Processor Readout," arXiv:1509.05811v2 [quant-ph], Apr. 22, 2016, 8 pages.
Written Opinion for PCT/US2019/047747, mailed Jun. 26, 2020, 4 pages.
Written Opinion for PCT/US2020/037222, mailed Sep. 17, 2020, 5 pages.
Yohannes et al, "Planarized, Extensible, Multilayer, Fabrication Process for Superconducting Electronics", IEEE Transactions on Applied Superconductivity, vol. 25, No. 3, Jun. 2015.
Whittaker, J.D. , et al., "A frequency and sensitivity tunable microresonator array for high-speed quantum," arXiv:1509.05811v2 [quant-ph], Apr. 22, 2016, 8 pages, Apr. 22, 2016.
International Search Report & Written Opinion for PCT/US2020/041703 mailed Oct. 27, 2020, 9 pages.
Harris et al., "Experimental Demonstration of a Robust and Scalable Flux Qubit," arXiv:0909.4321v1, Sep. 24, 2009, 20 pages.
Whiticar, et al., Probing flux and charge noise with macroscopic resonant tunneling, arXiv:2210.01714v1 [quant-ph] Oct. 4, 2022. 11 pages.
King, Kibble-Zurek-like Scaling in the Fast Anneal Regime, 2021.
Notice of Reasons for Rejection dated Jul. 23, 2024, for Japanese Patent Application No. 2021-571752, 6 pages.
Notice of Allowance for U.S. Appl. No. 17/272,052, mailed Aug. 3, 2023, 10 pages.

* cited by examiner

SYSTEMS AND METHODS FOR SIMULATING A QUANTUM PROCESSOR

FIELD

This disclosure generally relates to systems and methods for simulating a quantum processor. The disclosed systems and techniques can be applied to a digital processor or to a computing system including a digital processor and a quantum processor. The digital processor is operable to generate a digital waveform representation based on an analog waveform, and compute a response based on a set of waveform values and physical parameter values via a representation model. Systems and methods for generating and validating the device connectivity representation are also described.

BACKGROUND

Quantum Computation

A quantum computer is a system that makes direct use of at least one quantum-mechanical phenomenon, such as superposition, tunneling, and entanglement, to perform operations on data. The elements of a quantum computer are qubits. Quantum computers can provide speedup for certain classes of computational problems such as computational problems simulating quantum physics.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. Quantum annealing may use quantum effects, such as quantum tunneling, as a source of delocalization to reach an energy minimum more accurately and/or more quickly than classical annealing.

Adiabatic quantum computation may be considered a special case of quantum annealing. In adiabatic quantum computation, ideally, the system begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of disorder during the annealing process. An objective function, such as an optimization problem, is encoded in a Hamiltonian $H_P$, and the algorithm introduces quantum effects by adding a disordering Hamiltonian $H_D$ that does not commute with $H_P$. An example case is:

$$H_E \propto A(t)H_D + B(t)H_P$$

where $A(t)$ and $B(t)$ are time dependent envelope functions. For example, $A(t)$ can change from a large value to substantially zero during the evolution and $H_E$ can be thought of as an evolution Hamiltonian. The disorder is slowly removed by removing $H_D$ (i.e., by reducing $A(t)$).

Thus, in quantum annealing, the system starts with an initial Hamiltonian and evolves through an evolution Hamiltonian to a final "problem" Hamiltonian $H_P$ whose ground state encodes a solution to the problem.

A common problem Hamiltonian includes a first component proportional to diagonal single qubit terms and a second component proportional to diagonal multi-qubit terms, and may be of the following form:

$$H_P \propto -\frac{\varepsilon}{2}\left[\sum_{i=1}^{N} h_i \sigma_i^z + \sum_{j>i}^{N} J_{ij}\sigma_i^z\sigma_j^z\right]$$

where N represents the number of qubits, $\sigma_i^z$ is the Pauli z-matrix for the $i^{th}$ qubit, $h_i$ and $J_{ij}$ are dimensionless local fields for the qubits, and couplings between qubits, respectively, and $\varepsilon$ is some characteristic energy scale for $H_P$.

Here, the $\sigma_i^z$ and $\sigma_i^z\sigma_j^z$ terms are examples of diagonal terms. The former is a single-qubit term, and the latter a two-qubit term.

Throughout this specification, the terms "problem Hamiltonian" and "final Hamiltonian" are used interchangeably unless the context dictates otherwise. Certain states of the quantum processor are, energetically preferred, or simply preferred by the problem Hamiltonian. These include the ground states but may include excited states.

Hybrid Computing System Comprising a Quantum Processor

A hybrid computing system can include a digital computer communicatively coupled to an analog computer. In some implementations, the analog computer is a quantum computer and the digital computer is a classical computer. A quantum computer can be a gate-model quantum computer or a quantum computer that performs adiabatic quantum computation. The digital computer can include a digital processor that can be used to perform classical digital processing tasks described in the present systems and methods. The digital computer can include at least one system memory which can be used to store various sets of computer- or processor-readable instructions, application programs and/or data.

The quantum computer can include a quantum processor with programmable elements such as qubits, couplers, and other programmable devices. The qubits can be read out via a readout system, and the results communicated to the digital computer. The qubits and the couplers can be characterized by a qubit control system and a coupler control system, respectively. In some implementations, the qubit and the coupler control systems can be used to implement quantum annealing on the analog computer.

A computing system can include a server that takes a problem Hamiltonian and compiles it into commands that are sent to either a digital processor or an analog processor. It can be advantageous for a system to include more than one server in order to reduce variations in problem solving throughput.

Testing, developing, validating, and calibrating a quantum computing system typically requires a quantum processor that is installed in a cryogenic refrigerator. However, installing the quantum processor can be time and resource intensive, making user-ready quantum processors a limited resource. Furthermore, quantum processors are typically shared between multiple users. Some users may submit large problems to the quantum processor that are computationally expensive and take a long time to solve, which can further reduce the availability of quantum processors. In some cases, limited quantum processor availability can be a problem when a user needs to develop an experiment that is time-sensitive and other users are using the quantum processor. One approach to addressing this problem is to implement a quantum processor scheduler which allocates time on the quantum processor based on priority. However, it can be impractical to pause or stop problems that are in progress in order to run a different experiment instead. Another approach is to increase the number of quantum processors that are accessible. However, fabrication and installation of quantum processors can be expensive and can be time-consuming. Furthermore, in some cases, the number of programmable parameters may be limited for each device of the quantum processor which can make absolute validation of calibration processes and algorithms difficult.

The limited availability of quantum processors can also reduce the efficiency of processor design. Methods for designing processors can require a design object model that is generated based on a device connectivity representation. A device connectivity representation includes representations of devices in a processor and couplings of devices to one another extracted from a device connectivity data and couplings of devices to global bias lines.

The existence, various properties, biases, and connectivity of devices such as qubits, couplers, and readout devices can be programmatically extracted from a device connectivity representation. Typically, a device connectivity representation is generated manually from the intent of a design and the correctness of the device connectivity representation is validated by testing processor structures after fabrication. However, such manual validation methods are time-consuming and highly susceptible to errors. Additionally, manual validation methods require fabricated processors which are expensive and unsuitable for design verification.

Quantum processor calibration can involve calibration rules that are used for dependency resolution and to track progress. In some cases, calibration rules require describing and validating relationships between programmable devices, device connectivity, and bias mechanisms. One approach is to generate a suitable representation of such data and quantities is to devise a data structure for each calibration rule independently. However, designing a suitable data structure for each calibration algorithm is time-consuming, especially if there is significant overlap in requirements for a set of calibration algorithms. Furthermore, designing a suitable persistence and version control mechanism for each calibration algorithm is time-consuming, inefficient, and error prone.

Thus, there is a general desire for systems and methods to test an infrastructure of a quantum computing system, develop experiments for characterization and calibration purposes, and validate design object models associated with processor designs without depending on an available user-ready quantum processor.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

A quantum computing system comprises, in addition to one or more quantum computers and/or digital computer, an infrastructure to aid in building and operating the quantum computing system. A quantum computing infrastructure may comprise servers, device connectivity, software APIs, etc. Typically, to test a quantum computing system infrastructure (e.g., test server capacity, device connectivity validity, software connectivity, etc.), it is beneficial to have an already built quantum processor. Similarly, it is beneficial to have an already built quantum processor to develop experiments for characterization and calibration purposes, and to verify the accuracy and robustness of calibration algorithms. In addition, it is challenging to test design ideas before designing and fabricating actual processors.

A quantum computing system may be shared between users, including users that perform routine calibration and maintenance. Since only one user may be able to access the quantum computing system at a time, it can be inefficient to develop experiments that are time sensitive or that require extensive research. Also, developing and testing calibration processes for future generation of quantum processors may be postponed until a new processor chip is installed in a quantum computing system, incurring in delays in bringing a new quantum computer system in operation.

Therefore, there exists a need for systems and methods to test, develop, and calibrate a quantum computing system and to validate design object models without relying on the availability of a user-ready quantum processor.

A device object model, representing a physical design of a device, can be created by reading a device connectivity representation. The existence, various properties, biases, and connectivity of devices in the processor can be programmatically extracted from the device connectivity representation. Existing approaches for validating the design object model and/or the device connectivity representation require the associated processor to be fabricated, and validation steps are manual and consequently prone to error. Therefore, there exists a need for systems and methods for generating a device connectivity representation and validating a design object model without requiring fabrication of the associated processor.

Processor calibration can involve a set of calibration rules that require a description of relationships between programmable devices, device connectivity, and bias mechanisms for each calibration instance. Designing a suitable data structure for each calibration rule is time-consuming, especially if there is significant overlap in requirements for calibration rules. Designing a suitable persistence and version control mechanism separately for each calibration rule is time-consuming, inefficient, and error prone. Therefore, there exists a need for a data structure that is suitable to represent a processor in many calibration instances.

Aspect 1. A method of operation of at least one digital processor may be summarized as comprising: generating a digital waveform representation for a set of programmable devices of a quantum processor topology, the quantum processor topology specifying a set of control lines by which biases can be applied to at least one of the set of programmable devices; decomposing the digital waveform representation into a set of waveform values based on a device connectivity representation comprising a set of channels; identifying a subset of the set of channels in the device connectivity representation; selecting a subset of the set of waveform values that correspond to the subset of the set of channels; setting a plurality of physical parameter values characterizing at least one of the set of programmable devices of the quantum processor topology; and computing a response via a representation model.

Aspect 2. The method of aspect 1 wherein generating a digital waveform representation includes generating a digital waveform representation based on an analog waveform received from a server coupled to a quantum processor.

Aspect 3. The method of aspect 1 wherein decomposing the digital waveform representation into a set of waveform values includes decomposing the digital waveform representation into a set of waveform values based on the set of channels in the device connectivity representation, the set of channels representing a number of communicative couplings of the set of programmable devices to a set of control lines in the quantum processor topology.

Aspect 4. The method of aspect 1 wherein identifying a subset of the set of channels in the device connectivity representation includes identifying a subset of the set of channels representing a subset of the set of programmable devices communicatively coupled to a subset of the set of control lines in the quantum processor topology.

Aspect 5. The method of aspect 1 wherein selecting a subset of the set of waveform values corresponding to the subset of the set of channels includes selecting a subset of the set of waveform values that each represent a bias to apply to a respective qubit or coupler in the quantum processor topology.

Aspect 6. The method of aspect 1 wherein setting a plurality of physical parameter values characterizing at least one of the set of programmable devices in the quantum processor topology includes setting a plurality of physical parameter values for at least one of: a critical current, a body inductance, and a capacitance of a programmable device in a quantum processor topology.

Aspect 7. The method of aspect 1 wherein computing a response via a representation model includes computing a response based on the plurality of physical parameter values and the subset of the set of waveform values.

Aspect 8. The method of aspect 1 wherein computing a response via a representation model includes computing a set of output values.

Aspect 9. The method of aspect 1 may further comprise converting the response into a classical state.

Aspect 10. The method of aspect 1 may further comprise returning the response to a user.

Aspect 11. The method of aspect 1 wherein the quantum processor topology is embodied in at least one physical instance of a physical quantum processor, and generating a digital waveform representation for a set of programmable devices of a quantum processor topology includes generating the digital waveform representation for the at least one physical instance of the physical quantum processor.

Aspect 12. The method of aspect 1 wherein the quantum processor topology is embodied in at least one non-physical instance of a theoretical quantum processor, and generating a digital waveform representation for a set of programmable devices of a quantum processor topology includes generating the digital waveform representation for the at least one non-physical instance of the theoretical quantum processor.

Aspect 13. A system may be summarized as comprising: at least one digital processor; and at least one non-transitory computer-readable storage medium communicatively coupled to the at least one digital processor and that stores processor-executable instructions which, when executed, causes the at least one digital processor to perform the methods of any of the aspects 1 to 12.

Aspect 14. The system of aspect 13 may further comprise: at least one server operable to generate a waveform based on a received Hamiltonian that characterizes or represents a problem, the at least one server communicatively coupled to the at least one digital processor to provide the generated waveform thereto and the at least one server communicatively coupled to at least one quantum processor.

Aspect 15. A method of simulating a quantum processor, the quantum processor including a set of programmable devices communicatively coupled to a set of control lines, each one of the set of control lines operable to apply a bias to at least one of the set of programmable devices, the method executed by a digital processor, may be summarized as comprising: generating a digital waveform representation; decomposing the digital waveform representation into a set of waveform values based on a device connectivity representation comprising a set of channels; identifying a subset of the set of channels in the device connectivity representation; selecting a subset of the set of waveform values corresponding to the subset of the set of channels; setting a plurality of physical parameter values characterizing at least one of the set of programmable devices of the quantum processor; and computing a response via a representation model.

Aspect 16. The method of aspect 15 wherein generating a digital waveform representation includes generating a digital waveform representation based on an analog waveform received from a server coupled to a quantum processor.

Aspect 17. The method of aspect 15 wherein decomposing the digital waveform representation into a set of waveform values includes decomposing the digital waveform representation into a set of waveform values based on the set of channels in the device connectivity representation, the set of channels representing a number of communicative couplings of the set of programmable devices to a set of control lines in a quantum processor.

Aspect 18. The method of aspect 15 wherein identifying a subset of the set of channels in the device connectivity representation includes identifying a subset of the set of channels representing a subset of the set of programmable devices communicatively coupled to a subset of the set of control lines in a quantum processor.

Aspect 19. The method of aspect 15 wherein selecting a subset of the set of waveform values corresponding to the subset of the set of channels includes selecting a subset of the set of waveform values that each represent a bias applied to a respective programmable device in a quantum processor.

Aspect 20. The method of aspect 19 wherein selecting a subset of the set of waveform values that each represent a bias applied to a respective programmable device in a quantum processor includes selecting a subset of the set of waveform values that each represent a bias applied to a qubit in a quantum processor.

Aspect 21. The method of aspect 19 wherein selecting a subset of the set of waveform values that each represent a bias applied to a respective programmable device in a quantum processor includes selecting a subset of the set of waveform values that each represent a bias applied to a coupler in a quantum processor.

Aspect 22. The method of aspect 15 wherein setting a plurality of physical parameter values characterizing at least one of the set of programmable devices in a quantum processor includes setting a plurality of physical parameter values for at least one of: a critical current, a body inductance, and a capacitance of a programmable device in a quantum processor.

Aspect 23. The method of aspect 15 wherein computing a response via a representation model includes computing a response based on the plurality of physical parameter values and the subset of the set of waveform values.

Aspect 24. The method of aspect 15 wherein computing a response via a representation model includes computing a set of output values.

Aspect 25. The method of aspect 15 may further comprise: converting the response into a classical state.

Aspect 26. The method of aspect 150 may further comprise: returning the response to a user.

Aspect 27. A system for simulating a quantum processor, the quantum processor including a set of programmable devices communicatively coupled to a set of control lines, each one of the set of control lines operable to apply a bias to one of the set of programmable devices, may be summarized as comprising: a digital processor; and a non-transitory computer-readable storage medium that stores processor-executable instructions which, when executed, causes the digital processor to perform the method of any of the aspects 15 to 26.

Aspect 28. A method of extracting a device object model from an integrated circuit layout, the method executed by a digital processor, may be summarized as comprising autonomously by the digital processor: extracting a device schematic from a design schematic; extracting device connectivity data from the device schematic; writing the device connectivity data to a device connectivity representation; extracting a set of biases from the device connectivity data; and writing the set of biases to the device connectivity representation.

Aspect 29. The method of aspect 28 wherein extracting a device schematic from a design schematic includes extracting a device schematic from a design schematic that is verifiable by a layout-versus-schematic tool.

Aspect 30. The method of aspect 28 wherein extracting a device schematic from a design schematic includes extracting a device schematic corresponding to a directed acyclic graph.

Aspect 31. The method of aspect 30 wherein extracting a device schematic corresponding to a directed acyclic graph includes extracting a device schematic comprising at least one atomic device node corresponding to a directed acyclic graph.

Aspect 32. The method of aspect 28 wherein extracting the device connectivity data includes extracting at least one of: a device specification, a property annotation, and at least one neighboring device connection.

Aspect 33. The method of aspect 28 wherein extracting a set of biases from the device connectivity data includes extracting a set of global biases.

Aspect 34. The method of aspect 33 wherein extracting a set of global biases includes extracting a set of connections electrically coupling a pad to at least one programmable device.

Aspect 35. The method of aspect 28 may further comprise executing the device connectivity representation to compute a device object model.

Aspect 36. A computing system may be summarized as comprising:

at least one digital processor; and at least one non-transitory processor-readable storage medium communicatively couplable to the at least one digital processor and that stores at least one of processor-executable instructions which, when executed by the at least one digital processor, causes the at least one digital processor to perform the method of any of the aspects 28 to 35.

Aspect 37. A method of validating a design of an analog processor comprising a set of programmable devices, the method executed by a digital processor, may be comprised autonomously by the digital processor: loading a device connectivity representation based on at least a portion of a design implementation, the device connectivity representation including a set of properties characterizing at least one programmable device; identifying a set of n rules; iteratively, until the device connectivity representation passes the $n^{th}$ rule: selecting an $i^{th}$ rule of the set of rules, where $1 \leq i \leq n$; and determining if the device connectivity representation passes or fails the $i^{th}$ rule.

Aspect 38. The method of aspect 37 may further comprise: in response to the determination that the device connectivity representation fails the $i^{th}$ rule, until the device connectivity representation passes the $i^{th}$ rule, repeatedly: identifying at least one property of the set of properties that fails the $i^{th}$ rule; identifying a portion of the design implementation corresponding to the at least one property that fails the $i^{th}$ rule; and adjusting the design implementation.

Aspect 39. The method of aspect 37 wherein identifying a set of rules includes identifying a set of rules checking a number of programmable devices.

Aspect 40. The method of aspect 37 wherein identifying a set of rules includes identifying a set of rules checking a number of control devices.

Aspect 41. The method of aspect 37 wherein identifying a set of rules includes identifying a set of rules checking a set of device connectivity data properties.

Aspect 42. The method of aspect 37 wherein identifying a set of rules includes identifying a set of rules checking a set of addressing line properties.

Aspect 43. A computing system may be summarized as comprising: at least one digital processor; and at least one non-transitory processor-readable storage medium communicatively couplable to the at least one digital processor and that stores at least one of processor-executable instructions which, when executed by the at least one digital processor, causes the at least one digital processor to perform the method of any of the aspects 37 to 42.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
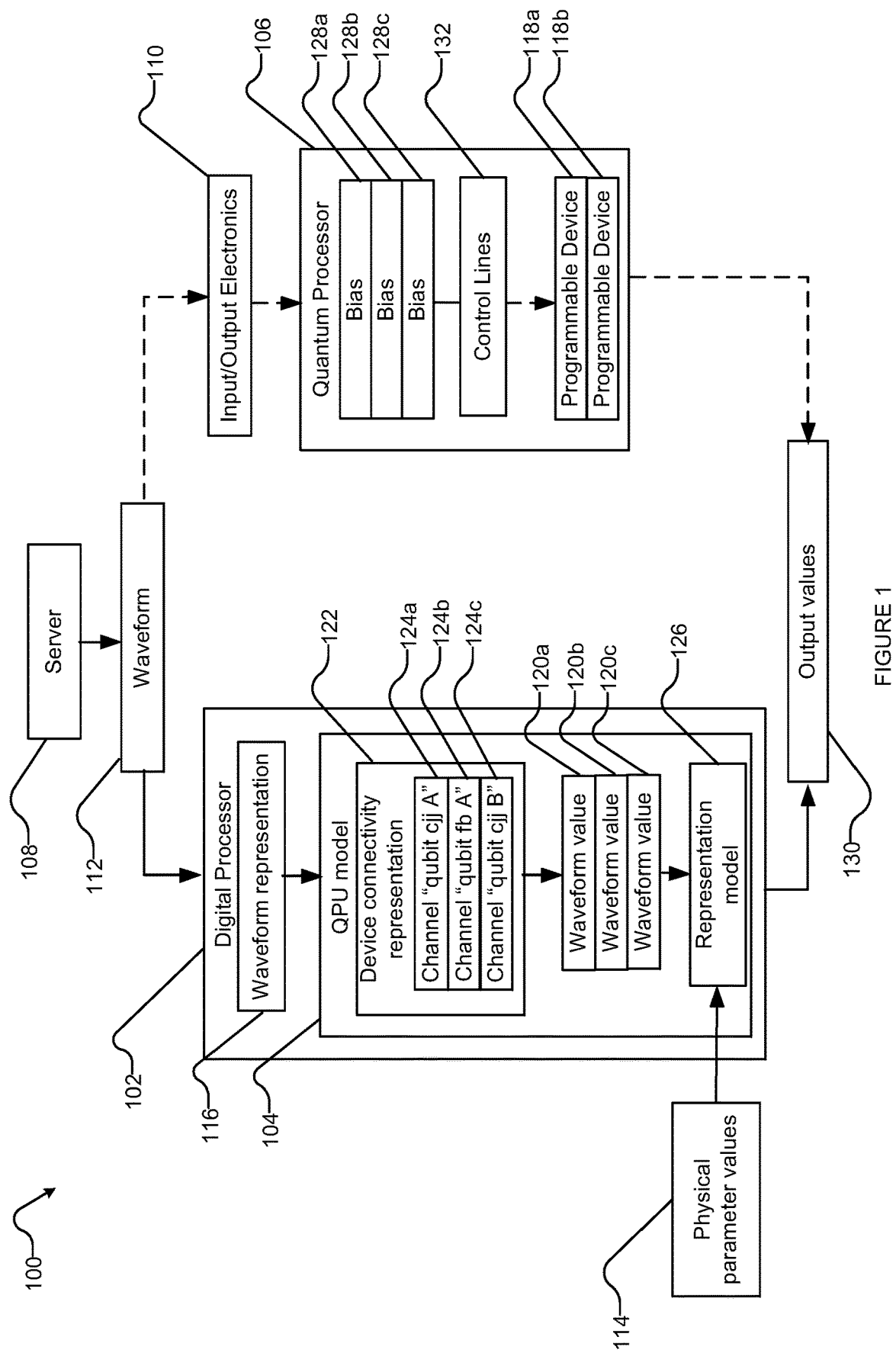
FIG. 1 is a schematic diagram of an example computing system including a quantum processor and a digital processor in communication with a storage medium that stores instructions associated with a quantum processing unit (QPU) model, in accordance with the present systems and methods.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

The term 'representation model' is used in this specification and the appended claims to include, for example, numerical or analytical methods, mathematical models and physical simulations.

The term 'output value' is used in this specification and the appended claims to include, for example, eigenvalues, eigenvectors, output from a look up table, output from a mathematical model, waveforms, etc.

The term 'device connectivity representation' is used in this specification and the appended claims to include, for example, device connectivity files, databases, graphs, etc.

Typically, a quantum processor can allow access to only one user at a time so it can be relatively inefficient for a user to develop experiments that are time sensitive or require extensive research if multiple users require the quantum processor. One approach for addressing this issue is to use a digital processor implementing a quantum processing unit (QPU) model to represent the quantum processor for time sensitive or research-intensive experiments.

QPU Model for Simulating an Existing Physical Quantum Processor

A QPU model comprises a set of representation models that are executable by a digital computer. In some cases, the QPU model can be considered a software infrastructure that is a digital representation of a physical quantum processor. For example, the QPU model can be a digital representation of a physical quantum processor installed in a cryostat and the QPU model can be used to develop testing and calibration algorithms for the physical quantum processor while the physical quantum processor is unavailable. When the physical quantum processor becomes available, the testing and calibration algorithms developed via the QPU model can be executed on the physical quantum processor.

A physical quantum processor comprises programmable devices, such as qubits and couplers, in the form of superconducting quantum interference devices (SQUIDs). A QPU model can include a set of representation models (e.g., device models) that each characterize a response from a respective device or a combination of devices in the physical quantum processor. Each representation model can digitally represent a respective device in the physical quantum processor. For example, a first representation model can represent a qubit in the physical quantum processor, and a second representation model can represent a coupler in the physical quantum processor. A representation model can digitally represent qubits comprising compound Josephson Junctions (JJs). Examples of qubits in the form of JJ SQUIDs are described in U.S. Pat. No. 9,152,923.

QPU Model for Simulating a Quantum Processor Design

In some cases, the QPU model can be considered a software infrastructure that is a digital representation of a theoretical quantum processor (i.e., a quantum processor design that has not yet been fabricated into a physical quantum processor). A QPU model, which is implemented in a digital processor, can be useful for simulating a quantum processor design because a QPU model can circumvent some of the challenges associated with conventional methods for calibrating and testing physical quantum processors.

Conventional calibration techniques require a quantum processor to be fabricated. Variations in programmable devices (e.g., qubits, couplers, etc.) of a physical quantum processor can exist due to fabrication imperfections and can lead to poor results when performing a computation. A typical approach for addressing this is to adjust a set of physical parameters to at least partially homogenize the programmable devices across the physical quantum processor. Examples of such physical parameters include, but are not limited to, physical inductance, capacitance, and critical current. However, adjusting these physical parameters in a physical quantum processor can sometimes be difficult. For example, applying a bias to a qubit may be straightforward, while controlling critical current and inductance may be difficult. In such cases where physical parameters are difficult to control, the values for these physical parameters are derived from a response from the quantum processor. However, having these values as outputs rather than controllable inputs can significantly limit capabilities of the quantum processor because controlling these physical parameters is fundamental to proper operation of the quantum processor.

Thus, the aforementioned limitations of a physical quantum processor can render a digital representation of a quantum processor, such as a QPU model, favorable for calibration and design.

From a calibration context, a digital processor implementing a QPU model can be used to simulate an existing physical quantum processor so that calibration algorithms can be executed. For example, the digital processor can simulate a quantum processor that is unavailable because of usage by high-priority experiments. Instead of interrupting an experiment running on the physical quantum processor, the digital processor implementing the QPU model can be used to test the computing infrastructure (e.g., server capacity, device connectivity validation, solver connectivity, etc.) and develop calibration algorithms.

From a design context, using a digital processor implementing a QPU model to design a theoretical processor can be more flexible than using a physical quantum processor. This is because a user can input values for physical parameters into device models included in the QPU model implemented in a digital processor. However, adjusting these physical parameters in a physical quantum processor is difficult. A digital processor implementing a QPU model can allow a user to model a quantum processor design without spending resources to fabricate and test a physical quantum processor. Additionally, the ability to adjust physical parameters in a QPU model can be useful for developing calibration algorithms for future quantum processor designs before they are fabricated. For example, a digital processor implementing a QPU model can be used to develop algorithms that characterize how device responses are affected by varying physical parameters. Once the relationship is better understood, learnings can be applied to optimize a quantum processor design by, for example, determining specifications and device properties.

The present systems and methods describe a digital processor implementing a QPU model to simulate a quantum processor. The digital processor is coupled to a server that is operable to serve either a digital processor or a quantum processor. The digital processor is operable to receive an analog waveform that is executable on a quantum processor. The digital processor is operable to generate a digital representation of the waveform (referred to herein as the "waveform representation") upon receiving the waveform. The waveform representation can be decomposed into a set of waveform values by the digital processor. Each waveform value represents a bias applied to a programmable device in a quantum processor. Waveform values can be in the form of numerical values that are readable by the digital processor. Decomposing the waveform representation into waveform values can be based on a device connectivity representation implemented in the digital processor.

The device connectivity representation can be a rigorously accurate representation of a quantum processor (e.g., an existing physical quantum processor or a quantum processor design) and can include data characterizing the response of programmable devices in a quantum processor. The device connectivity representation can include data describing programmable device specifications and couplings between programmable devices, also referred to as "channels". For example, the device connectivity representation can include a channel describing a control line for biasing the compound Josephson Junction (CJJ) of a particular qubit.

The digital processor can implement the QPU model to decompose the waveform representation into waveform values based on the device connectivity representation. In one implementation, this can include determining a number of channels in the device connectivity representation which relate to a particular programmable device, select a set of waveform values that correspond to biases applied to the programmable device, and sending the set of waveform values to a representation model.

The digital processor is operable to set a number of physical parameter values to implement in the representation model. Based on the physical parameter values and the waveform values, the digital processor can implement the representation model to compute a set of output values characterizing a response. In some cases, values for annealing parameters, including persistent current and tunneling energy, can be derived from the set of output values.

A physical instance of a quantum processor or a design for a physical or even a theoretical quantum processor has an associated topology (e.g., a collection and arrangement of qubits, couplers, programming or biasing interfaces, control lines, and/or readouts (e.g., SQUIDS)) that inherently defines the quantum processor, and based on applied values (e.g., biases) defines the operation of the quantum processor. The quantum processor topology, for example, specifies a set of control lines through which biases can be applied to at least one device of the set of programmable devices.

FIG. 1 is a schematic diagram of an example computing system 100 including a digital processor 102 implementing a QPU model 104 to simulate a quantum processor 106. Digital processor 102 is in communication with a non-transitory computer-readable storage medium (not shown in FIG. 1, see FIG. 3). System 100 includes a server 108 that is operable to serve digital processor 102 and quantum processor 106. Server 108 is communicatively coupled to both digital processor 102 and quantum processor 106. Server 108 is coupled to quantum processor 106 via a set of input/output (I/O) electronics 110 (e.g., signal conductors, filters, switches, etc.) that are operable to transfer an analog waveform 112 to quantum processor 106.

Server 108 may be a hardware-based server or a software-based server executing on a processor-based device. Server 108 is operable to receive a Hamiltonian characterizing or representing a problem (e.g., a problem submitted by a user), and to generate a waveform 112 based on the Hamiltonian. Waveform 112 is executable on quantum processor 106 and is receivable by digital processor 102.

In some cases, waveform 112 is sent to digital processor 102 when quantum processor 106 is unavailable. For example, when quantum processor 106 is unavailable to due to other users, waveform 112 is sent to digital processor 102 which is in communication with a non-transitory processor-readable storage medium (e.g., memory circuits, magnetic or optical media) storing processor-executable instructions associated with QPU model 104.

In other cases, waveform 112 is sent to digital processor 102 when a user is interested in simulating a theoretical quantum processor or a quantum processor design. For example, when a user is designing a theoretical quantum processor, it may be desirable to adjust physical parameter values 114 of devices of the theoretical quantum processor, submit a problem to server 108, and observe a response of QPU model 104 in order to optimize the theoretical quantum processor. In such cases, quantum processor 106 of system 100 is a theoretical quantum processor or quantum processor design. Learnings from simulating the theoretical quantum processor with adjusted physical parameter values 114 can be applied to design cycles prior to fabricating a physical quantum processor.

If a problem is to be solved on quantum processor 106, waveform 112 follows a sequence illustrated by the dashed arrows in FIG. 1. If a problem is to be solved on digital processor 102, waveform 112 follows a sequence illustrated by the solid arrows in FIG. 1. The sequence illustrated by the solid arrows is described immediately below.

Waveform 112 is executable on quantum processor 106 and receivable by digital processor 102. Digital processor 102 is in communication with at least one non-transitory storage medium storing processor-executable instructions for implementing QPU model 104. In operation, upon receiving waveform 112, digital processor 102 generates a digital waveform representation 116 that characterizes or represents a set of programmable devices 118 of quantum processor 106. Digital processor 102 decomposes digital waveform representation 116 into a set of waveform values 120a, 120b, 120c (collectively and individually 120). Only three waveform values 120 are shown in FIG. 1 for simplicity of illustration; however, a person skilled in art will understand that digital waveform representation 116 may be decomposed into less than or more than three waveform values 120. Waveform values 120 can be a set of numbers that represent biases applied to programmable devices 118 of quantum processor 106.

Digital processor 102 is operable to identify the programmable devices 118 being simulated and to implement a device connectivity representation 122. Device connectivity representation 122 includes a number of channels 124a, 124b, 124c (collectively, 124), each representing a communicative coupling of a programmable device 118 to a control line for applying a bias or another programmable device 118. Only three channels 124 are shown in FIG. 1 for simplicity of illustration; however, a person skilled in art will understand that device connectivity representation 122 may include less than or more than three channels 124. Device connectivity representation 122 also includes data that characterizes or represents device specification, device connectivity, and biases applied to programmable devices 118 in quantum processor 106. In some implementations, quantum processor 106 is a quantum processor design (i.e., a theoretical quantum processor). Digital processor 102 is operable to identify a subset of channels 124 in device connectivity representation 122 that control the programmable devices being simulated and is operable to select a corresponding subset of waveform values 120 to send to a representation model 126.

Each waveform value 120 corresponds to a respective one of a set of biases 128 (individually 128a, 128b, 128c) applied to programmable devices 118 of quantum processor 106. Only three biases 128 are shown in FIG. 1 for simplicity of illustration; however, a person skilled in art will understand that less than or more than three biases 128 may be applied to programmable devices 118. In one implementation, a waveform value 120a can correspond to a bias 128a that is applied to a qubit and can correspond to the $h_i$ terms in a system Hamiltonian. In one implementation, a waveform value 120b can correspond to a bias 128b that is applied to a coupler to set a coupling strength and can correspond to the $J_{ij}$ terms in a system Hamiltonian (i.e., a coupling strength of a coupler in a quantum processor).

When instructions associated with QPU model 104 are executed, digital processor 102 sets a number of physical parameter values 114. Physical parameters values 114 include macroscopic (i.e., directly measurable) parameter values that characterize the behavior of a programmable device 118. In some cases, physical parameter values 114 can be adjusted to at least partially homogenize programmable devices 118 across quantum processor 106. Physical parameter values 114 can include values for a critical current, an inductance, a capacitance, or a combination thereof. In one implementation, a physical parameter is a critical current carried by a Josephson junction of a programmable device. In one implementation, a physical parameter value is a value for capacitance across a Josephson junction of a programmable device. In one implementation, a physical parameter value is a value for inductance in a body loop of a programmable device. At least a portion of physical parameter values 114 are derived from the design of quantum processor 106 and programmable devices 118. In some implementations, where quantum processor 106 is a theoretical quantum processor, at least a portion of physical parameter values 114 are defined by an external user.

Digital processor 102 uses representation model 126 to compute a response in the form of a set of output values 130 based on physical parameter values 114 and waveform values 120. In some implementations, representation model 126 characterizes or represents a respective response of an individual programmable device 118. In some implementations, representation model 126 characterizes a response of multiple programmable devices 118. Annealing parameters of a programmable device can be derived from output values 130. Annealing parameters can provide information about energy scales of quantum processor 106. For example, annealing parameters such as a tunneling energy and a persistent current of a qubit can be derived from output values 130. In some cases, quantum processor 106 is a theoretical quantum processor or a quantum processor design. In some implementations, digital processor 102 converts output values 130 into a classical state (e.g., +1 or −1 state) and returns the classical state to the user via digital processor 102.

In a example application of system 100 in operation, a user sends a request to server 108 to simulate biasing a programmable device 118 named "qubit A" in quantum processor 106 for a calibration experiment. Server 108 generates and sends a waveform 112 to digital processor 102. Upon receiving waveform 112, digital processor 102 generates a digital waveform representation 116 that characterizes or represents all programmable devices 118 (e.g., "qubit A", "qubit B", etc.) of quantum processor 106. Digital processor 102 decomposes digital waveform representation 116 into a set of waveform values 120 representing biases applied to all programmable devices 118 of quantum processor 106. Device connectivity representation 122 includes a first channel 124a "qubit-cjj-A" representing a bias applied on the CJJ of "qubit A", a second channel 124b "qubit-fb-A" representing a bias applied on the body loop of "qubit A", and a third channel 124c "qubit-cjj-B" representing a bias applied on the CJJ of "qubit B". (It is noted that typically implementations may employ a substantially larger number of channels 124, and three channels is selected here only for convenience of description.) To simulate "qubit A", digital processor 102 identifies a subset of channels (e.g., channel "qubit-cjj-A" 124a and channel "qubit-fb-A" 124b) representing lines communicatively coupled to "qubit A" in device connectivity representation 122. Digital processor selects a corresponding subset of waveform values 120a, 120b that represent instructions to apply a bias into channel "qubit-cjj-A" and a bias into channel "qubit-fb-A" from waveform values 120. Digital processor 102 uses representation model 126 to calculate a response based on waveform values 120a, 120b and physical parameter values 114.

In some cases, server 108 may send waveform 112 to be executed on quantum processor 106. If the problem is to be solved on quantum processor 106, waveform 112 is operable to follow a sequence illustrated by the dashed arrows in FIG. 1.

In an example implementation of the sequence illustrated by the dashed arrows, waveform 112 is executable on quantum processor 106. Quantum processor 106 is operable to receive waveform 112 via I/O electronics 110. Quantum processor 106 is operable to execute waveform 112, which can include applying biases 128 to programmable devices 118. Biases 128 can be applied to programmable devices 118 via control lines 132. Control lines 132 are communicatively coupled to programmable devices 118. For example, a bias can be applied to a qubit via a control line that is inductively coupled to the qubit to realize the $h_i$ term of a system Hamiltonian. In another example, a bias can be applied to a coupler via an inductively coupled control line to realize the $J_{11}$ terms of a system Hamiltonian.

Quantum processor 106 is operable to compute a response in the form of output values 130. Annealing parameters, which provide information about a quantum annealing process and energy scales (e.g., transverse energy A(s) and energy applied to the problem Hamiltonian B(s)), can be derived from output values 130. Examples of annealing parameters can include a persistent current, a tunneling energy, and other parameters of programmable devices 118. In some implementations, quantum processor 106 is not operable to set physical parameter values 114 and therefore, physical parameter values are derived. Physical parameter values 114 can be derived from output values 130. Examples of physical parameters can include critical current, inductance, and capacitance. In some cases, output values 130 computed by QPU model 104 are within a magnitude of or equal to output values 130 computed by quantum processor 106.

Figure 2:
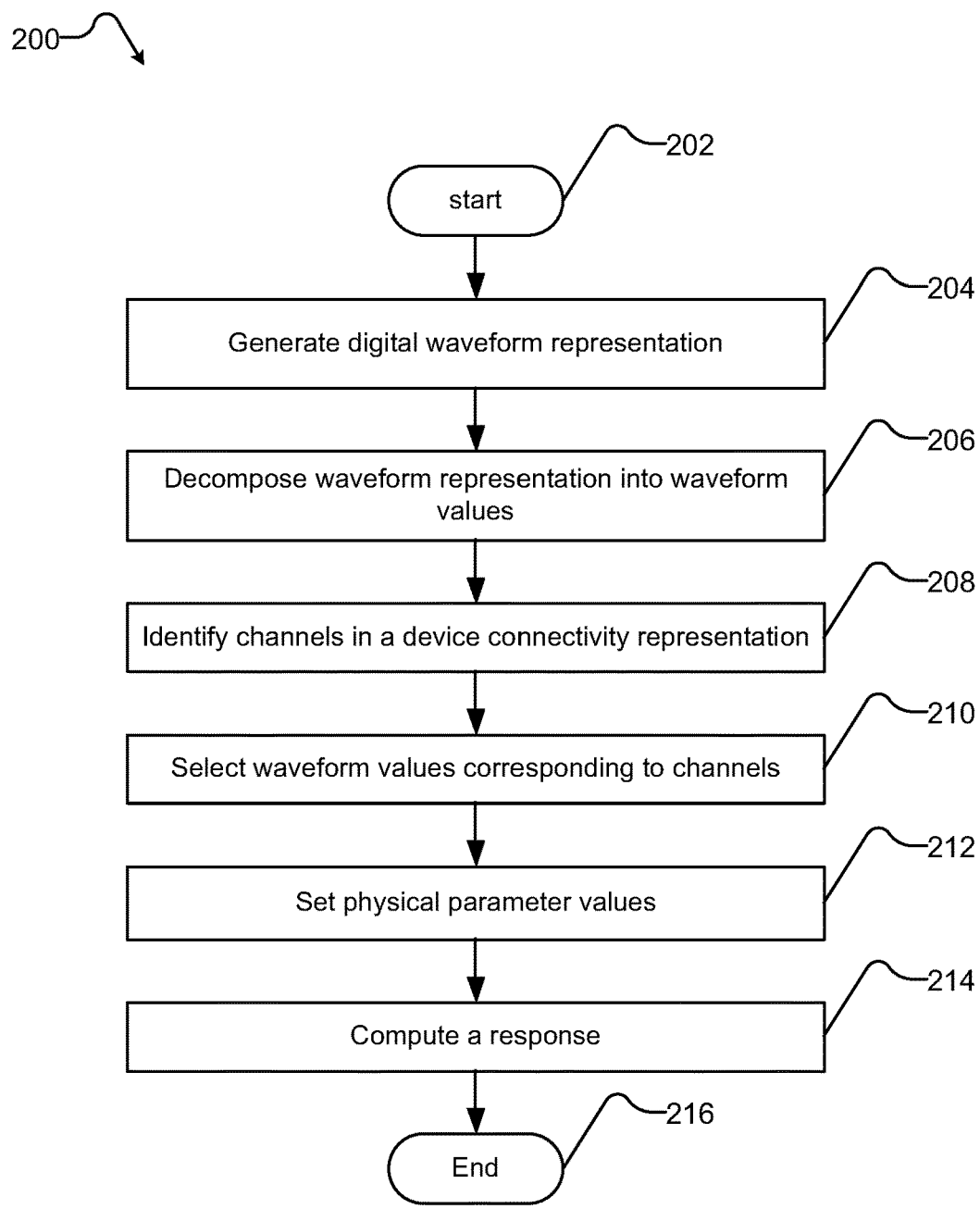
FIG. 2 is a flowchart illustrating a method of simulating a quantum processor, in accordance with the present systems and methods.

FIG. 2 is a flowchart illustrating a method 200 for simulating a quantum processor, in accordance with the present systems and methods. Method 200 includes acts 202-216, though in other implementations, certain acts can be omitted and/or additional acts can be added. Method 200 can be executed by a computing system including one or more digital processors, one or more non-transitory computer-readable storage medium (also referred to herein as a non-transitory processor-readable storage medium), and optionally a physical analog processor, in response to instructions or a problem submitted by a user.

Method 200 starts at 202, for example in response to a call from another routine.

At 204, a digital waveform representation is generated. Generating a digital waveform representation can include generating a digital waveform representation based on an analog waveform received from a server coupled to both a digital processor and a quantum processor. In one implementation, the digital waveform representation characterizes or represents a set of programmable devices in a quantum processor. In one implementation, the digital waveform representation characterizes or represents all programmable devices in a theoretical quantum processor (e.g., a quantum processor design).

At 206, a digital waveform representation is decomposed into a set of waveform values. The digital waveform representation can be decomposed into a set of waveform values based on a device connectivity representation comprising a number of channels. A device connectivity representation can include data characterizing device specification, device connectivity, and biases applied to programmable devices in a quantum processor. In one implementation, decomposing the digital waveform representation into a set of waveform values can include decomposing the digital waveform representation into a set of waveform values based on a number of channels representing communicative couplings of programmable devices to control lines that apply biases in a quantum processor.

At 208, a subset of channels in a device connectivity representation are identified. Identifying a subset of channels in a device connectivity representation can include identifying a subset of channels that control a subset of programmable devices in a quantum processor. In one implementation, identifying a subset of channels in a device connectivity representation includes identifying a subset of channels that control a subset of programmable devices in a theoretical quantum processor (i.e., a quantum processor design).

At 210, a subset of waveform values corresponding to a subset of channels is selected from the set of waveform values. Selecting a subset of waveform values corresponding to a subset of channels can include selecting a subset of waveform values that each represent a bias applied to a respective programmable device in a quantum processor. A waveform value can be a number or set of numbers that correspond to a respective bias applied to a qubit to realize the $h_i$ terms of a system Hamiltonian or to a respective bias applied to a coupler to realize the $J_{ij}$ terms (i.e., coupling strength) of a system Hamiltonian. In one implementation, selecting a subset of waveform values corresponding to a subset of channels includes selecting a subset of waveform values that each represent a bias applied to a qubit in a quantum processor. In one implementation, selecting a subset of waveform values corresponding to a subset of channels includes selecting a subset of waveform values that each represent a bias applied to a programmable device in a theoretical quantum processor (i.e., a quantum processor design).

At 212, a number of physical parameter values are set. Physical parameters include macroscopic (i.e., directly measurable) parameters that characterize the behavior of a programmable device. Physical parameter values can be set to at least partially homogenize programmable devices across a quantum processor. Examples of physical parameters can include a critical current carried by a JJ of a programmable device, an inductance of a body loop of a programmable device, a capacitance across a JJ of a programmable device, or a combination thereof. In one implementation, setting a number of physical parameter values can include setting values for a critical current, an inductance, a capacitance, or a combination thereof.

At 214, a response is computed. Computing a response can include implementing a representation model to compute a set of output values based on the number of physical parameter values set at 212 and the subset of waveform values selected at 210. A representation model characterizes a response of a programmable device or interactions between multiple programmable devices in a quantum processor. In some implementations, computing a response can include computing a set of output values characterizing a response of a set of programmable devices in a quantum processor. In some implementations, computing a response can include computing a set of output values characterizing a response of a set of programmable devices in a theoretical quantum processor (i.e., a quantum processor design). In some implementations, computing a response can also include converting a set of output values into a classical state and returning the classical state to a user.

At 216, method 200 ends, until it is, for example, invoked again.

Figure 3:
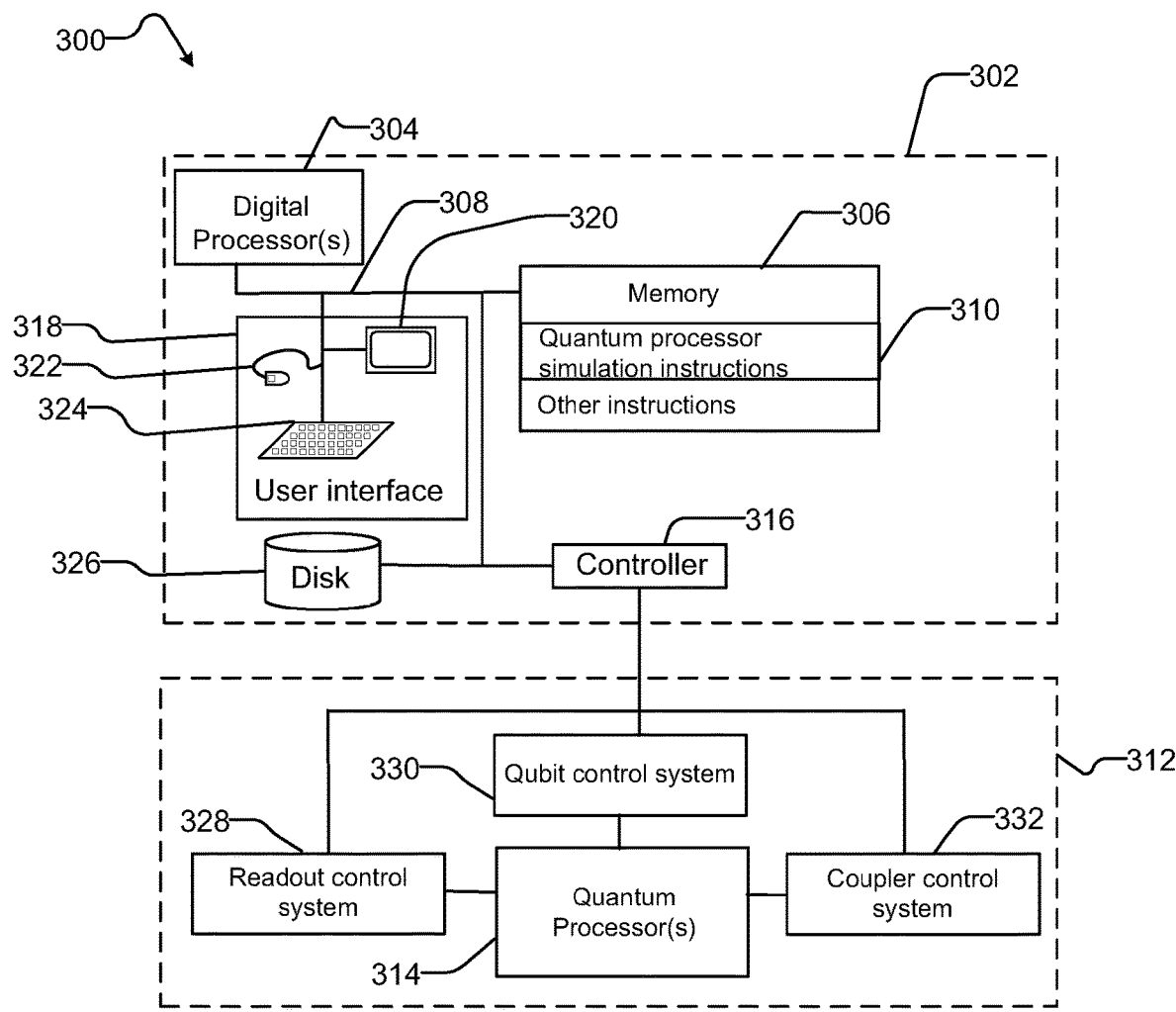
FIG. 3 is a schematic diagram of an exemplary computing system including a digital computer and an analog computer, in accordance with the present systems and methods.

FIG. 3 illustrates a computing system 300 comprising a digital computer 302. The example digital computer 302 includes one or more digital processors 304 that may be used to perform classical digital processing tasks. Digital computer 302 may further include at least one system memory 306, and at least one system bus 308 that couples various system components, including system memory 306, to digital processor(s) 304. System memory 306 may store a QPU model instructions module 310 and other instructions. Other instructions can include methods for extracting a device object model and for validating a processor design. System memory 306 may store processor-executable instructions to cause one or more processors to implement methods of gathering and modifying devices, methods of aggregating and retrieving data from an object device model, and methods of persisting and managing aggregate data. System memory 306 can store methods that can each be applied to a plurality of algorithms, for example, calibration algorithms.

System memory 306 can store a data structure to represent a processor in operation. A processor in operation can include a processor in calibration or testing. The data structure can be applied to a plurality of algorithms for calibration. The data structure can include a representation of a set of devices, connectivity between each of the set of devices, intrinsic properties of each device, and bias information for each device. System memory 306 can store an interface (e.g., device connectivity representation 614 of FIG. 6) for loading the data structure and a set of prescriptions for each device.

The digital processor(s) 304 may be any logic processing unit or circuitry (e.g., integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 300 comprises an analog computer 312, which may include one or more quantum processors 314. Digital computer 302 may communicate with analog computer 312 via, for instance, a controller 316. Certain computations may be performed by analog computer 312 at the instruction of digital computer 302, as described in greater detail herein.

Digital computer 302 may include a user input/output subsystem 318. In some implementations, the user input/output subsystem includes one or more user input/output components such as a display 320, mouse 322, and/or keyboard 324.

System bus 308 can employ any known bus structures or architectures, including a memory bus with a memory controller, a peripheral bus, and a local bus. System memory 306 may include non-volatile memory, such as read-only memory ("ROM"), static random access memory ("SRAM"), Flash NAND; and volatile memory such as random access memory ("RAM") (not shown), which may comprise the non-transitory computer- or processor-readable storage media.

Digital computer 302 may also include other non-transitory computer- or processor-readable storage media or non-volatile memory 326. Non-volatile memory 326 may take a variety of forms, including: a hard disk drive for reading from and writing to a hard disk (e.g., magnetic disk), an optical disk drive for reading from and writing to removable optical disks, and/or a solid state drive (SSD) for reading from and writing to solid state media (e.g., NAND-based Flash memory). The optical disk can be a CD-ROM or DVD, while the magnetic disk can be a rigid spinning magnetic disk or a magnetic floppy disk or diskette. Non-volatile memory 326 may communicate with digital processor(s) via system bus 308 and may include appropriate interfaces or controllers 316 coupled to system bus 308. Non-volatile memory 326 may serve as long-term storage for processor- or computer-readable instructions, data structures, or other data (sometimes called program modules) for digital computer 302.

Although digital computer 302 has been described as employing hard disks, optical disks and/or solid state storage media, those skilled in the relevant art will appreciate that other types of nontransitory and non-volatile computer-readable media may be employed, such magnetic cassettes, flash memory cards, Flash, ROMs, smart cards, etc. Those skilled in the relevant art will appreciate that some computer architectures employ nontransitory volatile memory and nontransitory non-volatile memory. For example, data in volatile memory can be cached to non-volatile memory. Or a solid-state disk that employs integrated circuits to provide non-volatile memory.

Various processor- or computer-readable instructions, data structures, or other data can be stored in system memory 306. For example, system memory 306 may store instruction for communicating with remote clients and scheduling use of resources including resources on the digital computer 302 and analog computer 312. Also, for example, system memory 306 may store at least one of processor executable instructions or data that, when executed by at least one processor, causes the at least one processor to execute the various algorithms to execute instructions to perform quantum processor simulation methods described herein. For instance, system memory 306 may store a quantum processor simulation instructions module 310 that includes processor- or computer-readable instructions to generate a digital waveform representation, select waveform values corresponding to channels in a device connectivity representation, and/or compute a response. Such provision may comprise decomposing the waveform representation into a set of waveform values and computing a set of output values, e.g., as described in greater detail herein.

In some implementations system memory 306 may store processor- or computer-readable calculation instructions and/or data to perform pre-processing, co-processing, and post-processing to analog computer 312. System memory 306 may store a set of analog computer interface instructions to interact with analog computer 312. Analog computer 312 may include at least one analog processor such as quantum processor 314. Analog computer 312 can be provided in an isolated environment, for example, in an isolated environment that shields the internal elements of the quantum computer from heat, magnetic field, and other external noise (not shown). The isolated environment may include a refrigerator, for instance a dilution refrigerator, operable to cryogenically cool the analog processor, for example to temperature below approximately 1° Kelvin.

Analog computer 312 can include programmable elements such as qubits, couplers, and other programmable devices. Qubits can be read out via readout system 328. Readout results can be received by other computer- or processor-readable instructions of digital computer 302. Qubits can be controlled via a qubit control system 330. Qubit control system 330 can include on-chip digital-to-analog converters (DACs) and analog lines that are operable to apply a bias to a target device. Couplers that couple qubits can be controlled via a coupler control system 332. Coupler control system 332 can include tuning elements such as on-chip DACs and analog lines.

Figure 4:
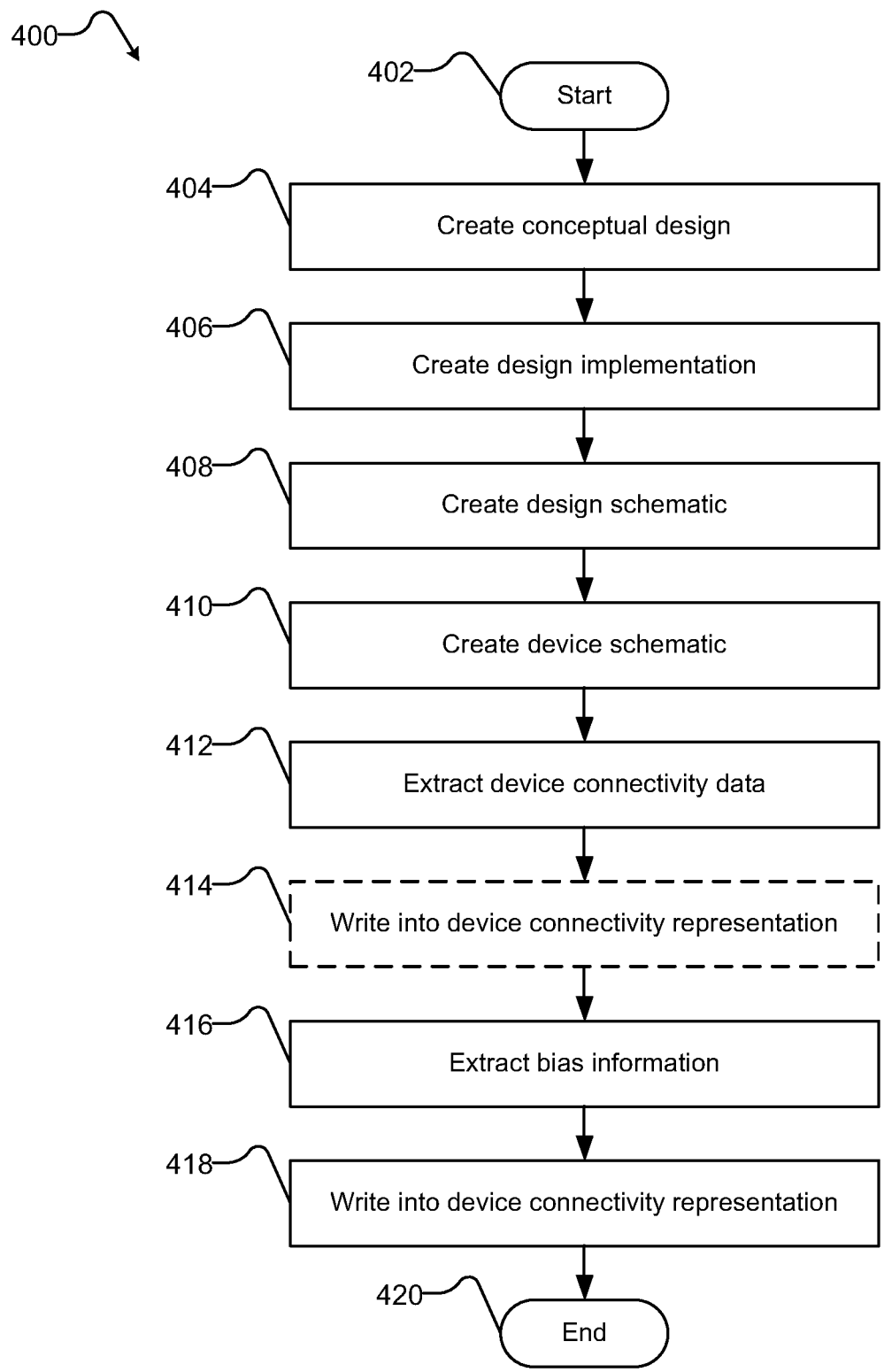
FIG. 4 is a flow diagram of an example method of generating a device connectivity representation by a processor, in accordance with the present systems and methods.
Figure 5:
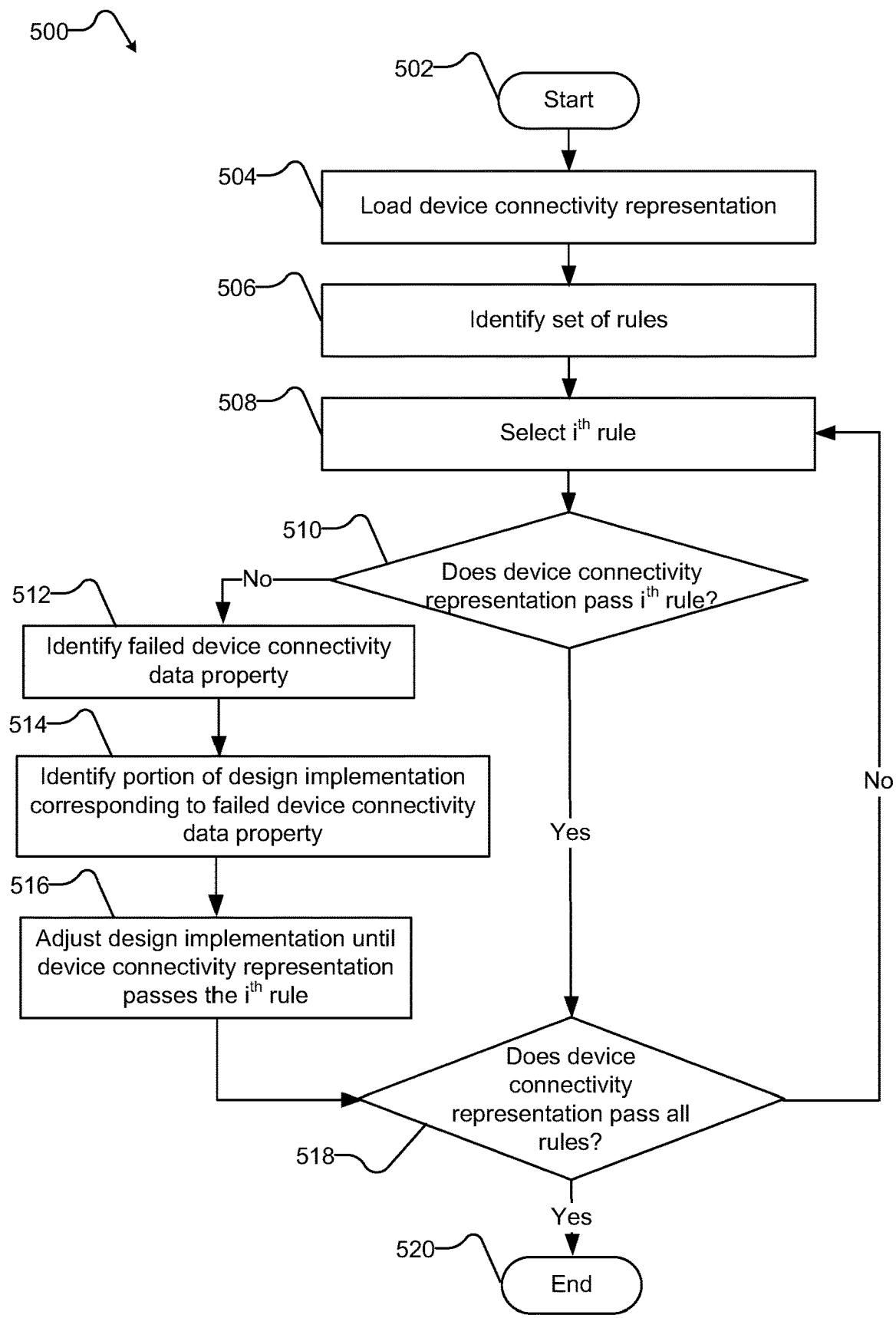
FIG. 5 is a flow diagram of an example method of validating a device object model based on a device connectivity representation by a processor, in accordance with the present systems and methods.
Figure 6:
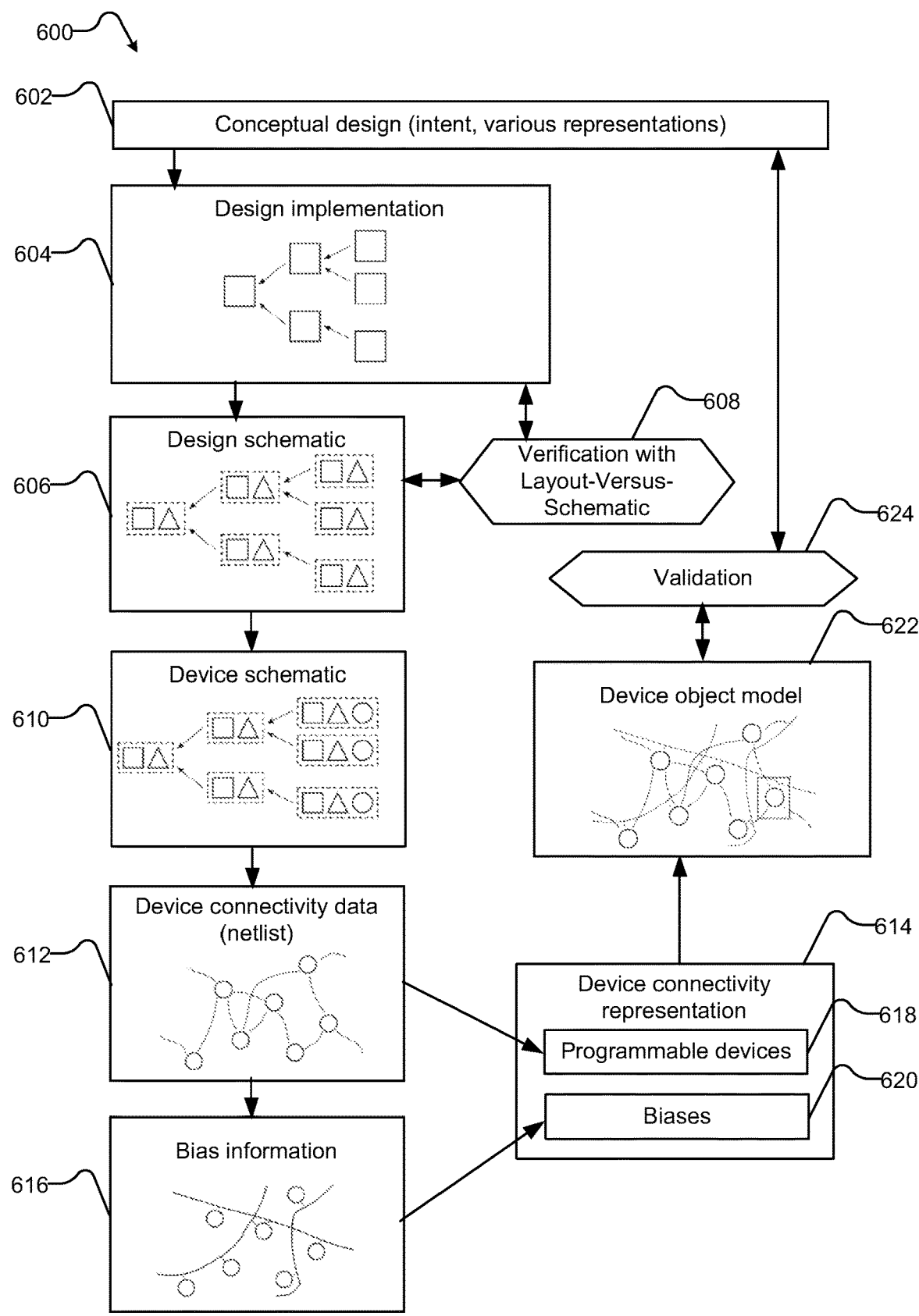
FIG. 6 is a schematic diagram of an example system of extracting and validating a design object model, in accordance with the present systems and methods.

A design object model is a representation of data of a system, for example a computing system, articulating the intent of the design of the system and can include a description of the input and output ports of a device in a processor (e.g., a quantum processor). A device object model, representing a physical design of a device, can be created by reading a device connectivity representation. The existence, various properties, biases, and connectivity of devices in the processor can be programmatically extracted from the device connectivity representation. Existing approaches for validating the design object model and/or the device connectivity representation require the associated processor to be fabricated, and validation steps are manual and consequently prone to error. FIG. 4, FIG. 5, and FIG. 6 describe systems and methods for generating a device connectivity representation and validating a design object model without requiring fabrication of the associated processor.

FIG. 4 is a flow diagram of an example method 400 of generating a device connectivity representation in a processor, in accordance with the present systems and methods. In some implementations, a device connectivity representation generated by method 400 can be implemented in device connectivity representation 122 of FIG. 1 or in method 200 of FIG. 2. In some implementations, method 400 can be succeeded by method 500 of FIG. 5. Method 400 includes acts 402-420, though in other implementations, certain acts can be omitted and/or additional acts can be added. Method 400 can be performed by a processor, such as digital processor 304 of FIG. 3.

Method 400 starts at 402, for example in response to a call from another routine.

At 404, a conceptual design is created. The conceptual design can be a representation of a user's intent for a processor design. The conceptual design can include a simulation of at least one structure or feature of a processor design. For example, the conceptual design can include a simulation of a Josephson junction in a superconducting integrated circuit.

At 406, a design implementation is created to realize the conceptual design. The design implementation can be an integrated circuit layout. In one implementation, creating a design implementation includes designing an analog processor layout in an analog design and simulation environment.

At 408, a design schematic is created. The design schematic may be created based on a design implementation (i.e., an analog processor layout). In one implementation, the design schematic may be created based on the conceptual design. The design schematic can be verifiable by a layout-versus-schematic tool. In some implementations, the design schematic is verifiable by other conventional electronic design automation tools. In one implementation, the design schematic can be created in the same analog design and simulation environment as the design implementation.

At 410, a device schematic is extracted. The device schematic may be extracted from on the design schematic. The device schematic may correspond to a directed acyclic graph. In one implementation, the device schematic includes at least one atomic device node that corresponds to an element (e.g., a vertex, a leaf, etc.) of a directed acyclic graph.

At 412, device connectivity data is extracted from the device schematic. The device connectivity data may be represented in a device connectivity graph. The device connectivity data can be extracted by a netlister, a tool to write out a device schematic to a text file, where each feature of the device connectivity data is represented. In one implementation, the device connectivity data is extracted by a custom-written netlister. The device connectivity data can include device properties and connectivity of each device to at least one neighboring device. One example of a device property is a device specification which indicates the device type or function. For instance, a device specification may indicate that the device is a qubit. Another example of a device property is a property annotation, which can include metadata attached to the device. The property annotation can include at least one default property. In one implementation, extracting the device connectivity data includes extracting a device specification, a property annotation, a neighboring device connection (i.e., local bias), or a combination thereof.

Optionally, at 414, the device connectivity data is written to a device connectivity representation stored on non-transitory computer-readable media.

At 416, bias information is extracted. Bias information can be extracted from the device connectivity data by an algorithm. Extracting bias information may include extracting a set of global biases. Global biases include biases applied to at least one device by a set of global bias lines. A global bias line can bias a set of devices in series. In a quantum processor, global bias lines electrically couple a pad (e.g., a bonding pad) to a set of devices and apply a respective bias to each of the devices. Bias information includes representations of electrical couplings of a pad to a respective set of devices in a quantum processor. In one implementation, extracting bias information includes extracting a set of local biases comprising biases applied to a device by at least one neighboring device.

At 418, the bias information is written to the device connectivity representation. If act 414 is omitted in method 400, the device connectivity data and the bias information are both written to the device connectivity representation at 418.

At 420, method 400 terminates, until it is, for example, invoked again.

In some cases, a device object model can be considered an accurate conceptual representation of a processor design. Thus, it can be desirable to perform certain checks on the device object model to validate correctness and completeness of the processor design. In one implementation, checks on the device object model can include checking that a certain number of qubits have been included. Since a device object model can be created by reading in a device connectivity representation in memory, a device object model can be validated by checking properties of the device connectivity representation, including device connectivity data properties, against a list of rules. The rules depend on the specific design of the processor and show the design intent. An example of a rule is the processor having a certain number of qubits. The device connectivity representation is part of a chain that includes a design implementation. Thus, in cases where a property does not pass a rule, the failed property can be identified and traced back to the design implementation, and the design implementation can be adjusted until the property passes the rule.

FIG. 5 is a flow diagram of an example method 500 of validating a device object model based on a device connectivity representation in a processor, in accordance with the present systems and methods. In some implementations, method 500 can be preceded by method 400 of FIG. 4. Method 500 includes acts 502 to 520, though in other implementations, certain acts can be omitted and/or additional acts can be added. Method 500 can be performed by a processor, such as digital processor 304 of FIG. 3.

Method 500 starts at 502, for example in response to a call from another routine.

At 504, a device connectivity representation is loaded. The device connectivity representation can be based on at least a portion of a design implementation (e.g., a design layout). The device connectivity representation can include a set of properties that characterize at least one programmable device. In one implementation, loading a device connectivity representation includes loading the device connectivity representation in a calibration environment. In some implementations, loading a device connectivity representation can include loading a device object model (e.g., device object model 622 in FIG. 6).

At 506, a set of n rules is identified. The set of n rules can check properties of the device connectivity representation. In some implementations, the set of n rules can check properties of the device schematic, the device connectivity data, the bias information, or a combination thereof. The set of n rules can check at least one of the following:

- Existence and/or number of programmable devices (e.g., qubits, couplers, shift register elements, readout elements, etc.).
- Completeness and/or number of control devices (e.g., digital-to-analog converters (DACs)) associated with each programmable device.
- Device connectivity data properties including qubit degree, connections between control devices and programmable devices, etc.
- A shift register graph including inspection of a visual representation of the shift register graph, couplings from qubits to readout elements (e.g., readout routes), etc.
- Addressing line properties including existence of uniquely addressable DACs, speed of parallel programming, efficiency of filling addressable spaces, etc.
- Bias-coloring of devices (e.g., ability of each qubit to anneal independently from neighboring qubits).

In some implementations, identifying a set of n rules can include identifying a set of n rules checking for properties that are different from the aforementioned properties.

At 508, an $i^{th}$ rule is selected from the set of n rules, where $1 \leq i \leq n$. For example, a first rule is selected from the set of n rules.

At 510, a determination of whether the device connectivity representation passes or fails the $i^{th}$ rule is made. For example, a digital processor can determine whether the device connectivity representation passes or fails a first rule. For example, a digital processor can determine whether the device connectivity representation includes a certain number of qubits. The device connectivity representation includes representations of devices that are written in from a device connectivity data. The device connectivity representation also includes representations of biases that are written in from bias information. Each element of the device connectivity representation can be associated with a respective device connectivity data property. Each device connectivity data property can correspond to a portion of the design implementation of act 504. If the device connectivity representation passes the $i^{th}$ rule, act 518 is performed. If the device connectivity representation fails the $i^{th}$ rule, act 512 is performed. For example, if the device connectivity representation fails the first rule indicating that the device connectivity representation requires a certain number of qubits, then act 512 is performed.

At 512, a failed device connectivity data property is identified. The failed device connectivity data property may fail the first rule. For example, if the first rule indicates the device connectivity data requires a certain number of qubits, the digital processor may identify the failed device connectivity data property as the number of qubits. The device connectivity data can be extracted from a device schematic that is based on a design schematic. In turn, the design schematic can be created based on the design implementation. Thus, a chain comprising the aforementioned elements (as described in system 600 of FIG. 6) can be traced from the device connectivity data to the design implementation.

At 514, a portion of the design implementation corresponding to the failed device connectivity data property is identified. For example, in the case of the first rule indicating the device connectivity representation requires a certain number of qubits, the design implementation can be an analog processor layout and the failed device connectivity data property is the number of qubits. Thus, the digital processor can identify a portion of the analog processor layout corresponding to the number of qubits.

At 516, at least a portion of the design implementation is adjusted until the device connectivity representation passes the $i^{th}$ rule. For example, in the case of the first rule indicating the device connectivity representation requires a certain number of quits, a portion of the analog processor layout can be adjusted. Adjusting the analog processor layout can directly or indirectly change the device connectivity representation by changing, for example, the failed device connectivity data property. The analog processor layout can be adjusted until the device connectivity representation includes the number of qubits indicated by the first rule. In some implementations, adjusting at least a portion of the design implementation can directly or indirectly change the device connectivity representation by changing a design schematic, a device schematic, bias information, or a combination thereof.

At 518, a determination of whether the device connectivity representation passes all of the set of n rules is made. If the device connectivity representation passes all of the set of n rules, method 500 ends at act 520, until it is, for example, invoked again. If the device connectivity representation does not pass all of the set of n rules or not all rules of the set n rules have been checked, act 508 is performed. In such cases, the next rule (i.e., the $i+1^{th}$ rule) is selected in act 508 and subsequent acts of method 500 are performed. For example, in at least one implementation n=2 and the set of n rules can comprise a first rule indicating the device connectivity representation requires a certain number of qubits and a second rule indicating the device connectivity representation requires a certain number of DACs. A digital processor may determine whether the device connectivity representation passes the two rules. If the device connectivity representation passes the two rules, method 500 ends at 520. If the device connectivity representation passes the first rule but not the second rule (i.e., includes the required number of qubits but does not include the required number of DACs, or the number of DACs has not been checked), then act 508 is performed. The second rule indicating the number of DACs is then identified and subsequent acts of method 500 are performed.

In some implementations, the device connectivity representation in method 500 can be replaced by a device object model. In such cases, act 504 is replaced with the act of loading a device object model. Loading a device object model can include extracting a device connectivity data and a representation of bias information from a device schematic. Loading a device object model can include loading the device connectivity data and the bias information in a calibration software environment. The device connectivity data can include local biases of a device on a neighboring device and the bias information can include global biases of an analog line on a set of devices.

Method 400 of FIG. 4 can be used to generate a device connectivity representation and method 500 of FIG. 5 can be used to validate a device object model. At least one of methods 400 and method 500 can be executed by a digital processor storing instructions including system 600 of FIG. 6.

FIG. 6 is a schematic diagram of an example system 600 to extract and validate a design object model. Elements of system 600 can be stored in a non-transitory computer-readable storage medium. The non-transitory computer-readable storage medium, when executed, causes a digital processor perform actions involving elements of system 600.

System 600 includes a conceptual design 602 which can be a representation of a user's intent for a processor design. In one implementation, conceptual design 602 can include a simulation of a structure (e.g., a Josephson junction) constituting a portion of a superconducting integrated circuit. Conceptual design 602 can be realized in a design implementation 604. Design implementation 604 can be at least a portion of a design layout. In one implementation, design implementation 604 is at least a portion of an integrated circuit design layout. In one implementation, design implementation 604 is at least a portion of an analog processor (e.g., a quantum processor) layout. Design implementation 604 can be created in an analog design and simulation environment. System 600 includes a design schematic 606 based on design implementation 604. In some implementations, design schematic 606 is based on conceptual design 602. Design schematic 606 can be verified against design implementation 604 using a layout-versus-schematic tool 608 or other electronic design automation tools. In one implementation, design implementation 604 and design schematic 606 can be created in the same analog design and simulation environment.

System 600 includes a device schematic 610. Device schematic 610 can be extracted from design schematic 606. In some implementations, device schematic 610 can be in the form of a directed acyclic graph. For example, device schematic 610 can include at least one atomic device node corresponding to an element (e.g., a vertex, a leaf, etc.) of a directed acyclic graph.

System 600 includes a device connectivity data 612. Device connectivity data 612 includes device properties and connectivity of each device to at least one neighboring device. In one implementation, device connectivity data 612 can be a graph. In one implementation, device connectivity data 612 includes a set of local biases comprising a bias applied to a device by at least one neighboring device. One example of a device property is a device specification, which can indicate a device type or function. For instance, a device specification may indicate that the device is a qubit. Another example of a device property is a property annotation, which can include metadata attached to the device. Device connectivity data 612 can also be known as a netlist. Device connectivity data 612 can be written into a device connectivity representation 614.

System 600 includes bias information 616. Bias information 616 can be extracted from device connectivity data 612. Bias information 616 includes a set of global biases comprising biases applied to at least one device by a set of global bias lines. In a quantum processor, global bias lines electrically couple a pad (e.g., a bonding pad) to a set of devices and apply a respective bias to each of the devices. A global bias line can bias a set of devices in series. Bias information 616 includes representations of electrical couplings of a pad to a respective set of devices. Bias information 616 can be written into device connectivity representation 614.

Device connectivity representation 614 includes representations of programmable devices 618 written in from device connectivity data 612 and representations of biases 620 written in from bias information 616. Device connectivity representation 614 can be read by a digital processor. In response to reading device connectivity representation 614, the digital processor can compute a device object model 622. In some implementations, device object model 622 can be computed by extracting device connectivity data 612 and bias information 616 from device schematic 610 (i.e., without device connectivity representation 614). Device connectivity data 612 and bias information 616 are operable to be loaded in a calibration software environment.

Elements of system 600 constitute a chain of reference from conceptual design 602 to device object model 622. Conceptual design 602 can be validated against device object model 622. Validation 624 can include checks on device object model 622 to assess conceptual correctness of conceptual design 602. Errors can be identified by tracing back through the chain of reference. A method of validation 624 is described by method 500 in FIG. 5. In some implementations, device object model 622 is a representation of a quantum processor.

Figure 7:
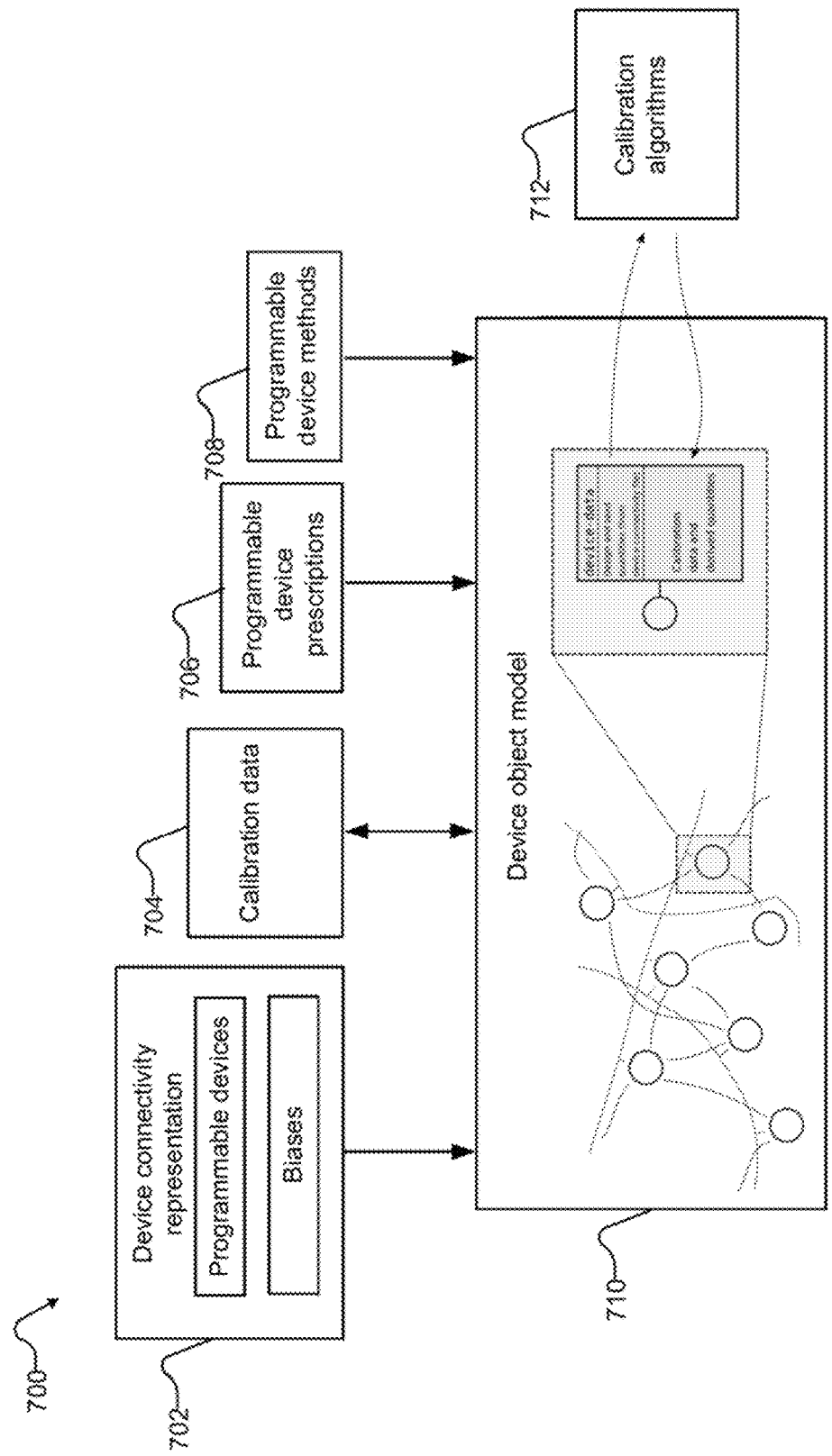
FIG. 7 is a schematic diagram illustrating an example data structure 700 operable to represent a processor in operation.

Processor calibration can involve a set of calibration rules that require a description of relationships between programmable devices, device connectivity, and bias mechanisms for each calibration instance. FIG. 7 illustrates a data structure that is suitable to represent a processor in many calibration instances and includes certain elements of system 600 in FIG. 6.

FIG. 7 is a schematic diagram illustrating an example data structure 700 operable to represent a processor in operation. Elements of date structure 700 can be stored in a non-transitory computer-readable storage medium. The non-transitory computer-readable storage medium, when executed, causes a digital processor perform actions involving elements of data structure 700.

Data structure 700 includes a device connectivity representation 702 comprising programmable device descriptions and bias information extracted from a device schematic (e.g., device schematic 610 of FIG. 6). Device connectivity representation 702 is an interface for loading programmable device descriptions into memory, thereby computing a device object model. Programmable device descriptions can include device specifications, device connectivity, intrinsic properties of each device, and local biases on each device by a neighboring device. Programmable device descriptions can be representative of a processor, such as an analog processor or quantum processor, under operation. In particular, programmable device descriptions can be representative of a quantum process under calibration. Examples of programmable devices include, but are not limited to: qubits, couplers, DACs, shift register stages, readout elements, inductance tuners, process control monitor devices, and heaters.

Data structure 700 includes a representation of persisted calibration data 704. Calibration data 704 can be data aggregated onto and retrieved from a device object model 710. Data structure 700 includes a representation of programmable device prescriptions 706. Programmable device prescriptions 706 include construction property annotation, bias annotation, and connectivity annotation for each programmable device. Programmable device prescriptions 706 include at least one set of metaobjects such as structures and classes. Data structure 700 also includes instructions for programmable device methods 708 including methods for gathering and modifying devices. Some examples of programmable device methods 708 can include, but are not limited to:

Identifying a set of qubits coupled to a particular qubit.
Identifying biases for addressing a particular DAC.
Identifying a set of DACs associated with a particular device.

Identifying shift register stages forming at least part of path from qubit to readout.

Device object model 710 includes programmable device representations based on device connectivity representation 702. Data structure 700 includes instructions for calibration algorithms 712. Calibration algorithms 712 can include methods for aggregating data and retrieving data from programmable device representations included in device object model 710. For example, calibration algorithms 712 can be used to aggregate data onto device representations from device object model 710 during calibration. Calibration algorithms 712 can include methods for persisting and managing versions of calibration data 704.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. No. 9,152,923; U.S. Patent Publication No. 2007/0239366; U.S. Patent Application No. 62/873,711, filed Jul. 12, 2019; and U.S. Patent Application No. 62/879,946, filed Jul. 29, 2019.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of operation of at least one digital processor, the digital processor communicatively coupled to at least one server, the method comprising:
   receiving an analog waveform from the at least one server;
   generating a digital waveform representation for a set of programmable devices of a quantum processor topology based on the analog waveform, the quantum processor topology specifying a set of control lines by which biases can be applied to at least one of the set of programmable devices;
   decomposing the digital waveform representation into a set of waveform values based on a device connectivity representation comprising a set of channels, each waveform value representing a bias applied to the at least one of the set of programmable devices;
   identifying a subset of the set of channels in the device connectivity representation;
   selecting a subset of the set of waveform values that correspond to the subset of the set of channels;
   setting a plurality of physical parameter values characterizing at least one of the set of programmable devices of the quantum processor topology; and
   computing a response via a representation model.

2. The method of claim 1 wherein receiving an analog waveform from the at least one server includes receiving an analog waveform from the at least one server, wherein the at least one server is communicatively coupled to a quantum processor.

3. The method of claim 1 wherein decomposing the digital waveform representation into a set of waveform values includes decomposing the digital waveform representation into a set of waveform values based on the set of channels in the device connectivity representation, the set of channels representing a number of communicative couplings of the set of programmable devices to a set of control lines in the quantum processor topology.

4. The method of claim 1 wherein identifying a subset of the set of channels in the device connectivity representation includes identifying a subset of the set of channels representing a subset of the set of programmable devices communicatively coupled to a subset of the set of control lines in the quantum processor topology.

5. The method of claim 1 wherein selecting a subset of the set of waveform values corresponding to the subset of the set of channels includes selecting a subset of the set of waveform values that each represent a bias to apply to one of: a respective qubit, and a respective coupler in the quantum processor topology.

6. The method of claim 1 wherein setting a plurality of physical parameter values characterizing at least one of the set of programmable devices in the quantum processor topology includes setting a plurality of physical parameter values for at least one of: a critical current, a body inductance, and a capacitance of a programmable device in a quantum processor topology.

7. The method of claim 1 wherein computing a response via a representation model includes computing a response based on the plurality of physical parameter values and the subset of the set of waveform values.

8. The method of claim 1 wherein the quantum processor topology is embodied in at least one physical instance of a physical quantum processor, and generating a digital waveform representation for a set of programmable devices of a quantum processor topology includes generating the digital waveform representation for the at least one physical instance of the physical quantum processor.

9. The method of claim 1 wherein the quantum processor topology is embodied in at least one non-physical instance of a theoretical quantum processor, and generating a digital waveform representation for a set of programmable devices of a quantum processor topology includes generating the digital waveform representation for the at least one non-physical instance of the theoretical quantum processor.

10. A system, the system comprising:
at least one digital processor communicatively coupled to at least one server; and
at least one non-transitory computer-readable storage medium communicatively coupled to the at least one digital processor and that stores processor-executable instructions which, when executed, causes the at least one digital processor to:
receive an analog waveform from the at least one server;
generate a digital waveform representation for a set of programmable devices of a quantum processor topology based on the analog waveform, the quantum processor topology specifying a set of control lines by which biases can be applied to at least one of the set of programmable devices;
decompose the digital waveform representation into a set of waveform values based on a device connectivity representation comprising a set of channels, each waveform value representing a bias applied to the at least one of the set of programmable devices;
identify a subset of the set of channels in the device connectivity representation;
select a subset of the set of waveform values that correspond to the subset of the set of channels;
set a plurality of physical parameter values characterizing at least one of the set of programmable devices of the quantum processor topology; and
compute a response via a representation.

11. The system of claim 10, wherein
the at least one server is operable to generate a waveform based on a received Hamiltonian that characterizes or represents a problem, the at least one server communicatively coupled to at least one quantum processor.

12. A method of simulating a quantum processor, the quantum processor including a set of programmable devices communicatively coupled to a set of control lines, each one of the set of control lines operable to apply a bias to at least one of the set of programmable devices, the method executed by a digital processor, the method comprising:
generating a digital waveform representation;
decomposing the digital waveform representation into a set of waveform values based on a device connectivity representation comprising a set of channels;
identifying a subset of the set of channels in the device connectivity representation;
selecting a subset of the set of waveform values corresponding to the subset of the set of channels;
setting a plurality of physical parameter values characterizing at least one of the set of programmable devices of the quantum processor; and
computing a response via a representation model.

13. The method of claim 12 wherein generating a digital waveform representation includes generating a digital waveform representation based on an analog waveform received from a server coupled to a quantum processor.

14. The method of claim 12 wherein decomposing the digital waveform representation into a set of waveform values includes decomposing the digital waveform representation into a set of waveform values based on the set of channels in the device connectivity representation, the set of channels representing a number of communicative couplings of the set of programmable devices to a set of control lines in a quantum processor.

15. The method of claim 12 wherein identifying a subset of the set of channels in the device connectivity representation includes identifying a subset of the set of channels representing a subset of the set of programmable devices communicatively coupled to a subset of the set of control lines in a quantum processor.

16. The method of claim 12 wherein selecting a subset of the set of waveform values corresponding to the subset of the set of channels includes selecting a subset of the set of waveform values that each represent a bias applied to a respective programmable device in a quantum processor.

17. The method of claim 16 wherein selecting a subset of the set of waveform values that each represent a bias applied to a respective programmable device in a quantum processor includes selecting a subset of the set of waveform values that each represent a bias applied to one of: a qubit in a quantum processor, and a coupler in a quantum processor.

18. The method of claim 12 wherein setting a plurality of physical parameter values characterizing at least one of the set of programmable devices in a quantum processor includes setting a plurality of physical parameter values for at least one of: a critical current, a body inductance, and a capacitance of a programmable device in a quantum processor.

19. The method of claim 12 wherein computing a response via a representation model includes computing a response based on the plurality of physical parameter values and the subset of the set of waveform values.

20. A system for simulating a quantum processor, the quantum processor including a set of programmable devices communicatively coupled to a set of control lines, each one of the set of control lines operable to apply a bias to one of the set of programmable devices, the system comprising:
a digital processor; and
a non-transitory computer-readable storage medium that stores processor-executable instructions which, when executed, causes the digital processor to:
generate a digital waveform representation;
decompose the digital waveform representation into a set of waveform values based on a device connectivity representation comprising a set of channels;
identify a subset of the set of channels in the device connectivity representation;
select a subset of the set of waveform values corresponding to the subset of the set of channels;
set a plurality of physical parameter values characterizing at least one of the set of programmable devices of the quantum processor; and
compute a response via a representation model.

* * * * *